(12) United States Patent
Kakehata

(10) Patent No.: US 7,790,563 B2
(45) Date of Patent: Sep. 7, 2010

(54) SEMICONDUCTOR DEVICE, ELECTRONIC DEVICE AND METHOD FOR MANUFACTURING SEMICONDUCTOR DEVICE

(75) Inventor: Tetsuya Kakehata, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 206 days.

(21) Appl. No.: 12/216,548

(22) Filed: Jul. 8, 2008

(65) Prior Publication Data
US 2009/0017568 A1 Jan. 15, 2009

(30) Foreign Application Priority Data
Jul. 13, 2007 (JP) .............................. 2007-184984

(51) Int. Cl.
*H01L 21/331* (2006.01)
(52) U.S. Cl. ........................ 438/311; 438/149; 438/197; 438/725; 438/663; 257/E21.17; 257/E21.051; 257/E21.058; 257/E21.134; 257/E21.125; 257/E21.245; 257/E21.247; 257/E21.248; 257/E21.267; 257/E21.304; 257/E21.311; 257/E21.319; 257/E21.329; 257/E21.321; 257/E21.32
(58) Field of Classification Search ................. 438/311, 438/149, 197, 474, 475, 510, 512, 514, 680, 438/692, 706, 663, 769, 728, 732, 608, 513; 257/E21.32, 17, 51, 58, 134, 135, 245, 247, 257/248, 267, 304, 311, 319, 321, 329
See application file for complete search history.

(56) References Cited

U.S. PATENT DOCUMENTS

| | | | |
|---|---|---|---|
| 5,374,564 A | 12/1994 | Bruel | |
| 5,624,851 A * | 4/1997 | Takayama et al. | ........... 438/166 |
| 5,677,549 A | 10/1997 | Takayama et al. | |
| 5,744,824 A | 4/1998 | Kousai et al. | |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |

(Continued)

FOREIGN PATENT DOCUMENTS

JP           08-006053           1/1996

(Continued)

*Primary Examiner*—David Nhu
(74) *Attorney, Agent, or Firm*—Eric J. Robinson; Robinson Intellectual Property Law Office, P.C.

(57) ABSTRACT

A semiconductor device of the present invention is manufactured by the following steps: forming a single-crystal semiconductor layer over a substrate having an insulating surface; irradiating a region of the single-crystal semiconductor layer with laser light; forming a circuit of a pixel portion using a region of the single-crystal semiconductor layer which is not irradiated with the laser light; and forming a driver circuit for driving the circuit of the pixel portion using the region of the single-crystal semiconductor layer which is irradiated with the laser light. Thus, a semiconductor device using a single-crystal semiconductor layer which is suitable for a peripheral driver circuit region and a single-crystal semiconductor layer which is suitable for a pixel region can be provided.

34 Claims, 15 Drawing Sheets

U.S. PATENT DOCUMENTS

| | | |
|---|---|---|
| 6,803,264 B2 | 10/2004 | Yamazaki et al. |
| 6,875,633 B2 | 4/2005 | Fukunaga |
| 7,176,525 B2 | 2/2007 | Fukunaga |
| 7,199,024 B2 | 4/2007 | Yamazaki |
| 7,223,938 B2 * | 5/2007 | Yamazaki et al. ........ 219/121.8 |
| 7,256,776 B2 | 8/2007 | Yamazaki et al. |
| 2004/0104424 A1 | 6/2004 | Yamazaki |
| 2005/0009252 A1 | 1/2005 | Yamazaki et al. |
| 2005/0048706 A1 | 3/2005 | Shimomura et al. |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0291022 A1 | 12/2007 | Yamazaki et al. |

FOREIGN PATENT DOCUMENTS

| | | |
|---|---|---|
| JP | 11-163363 | 6/1999 |

* cited by examiner

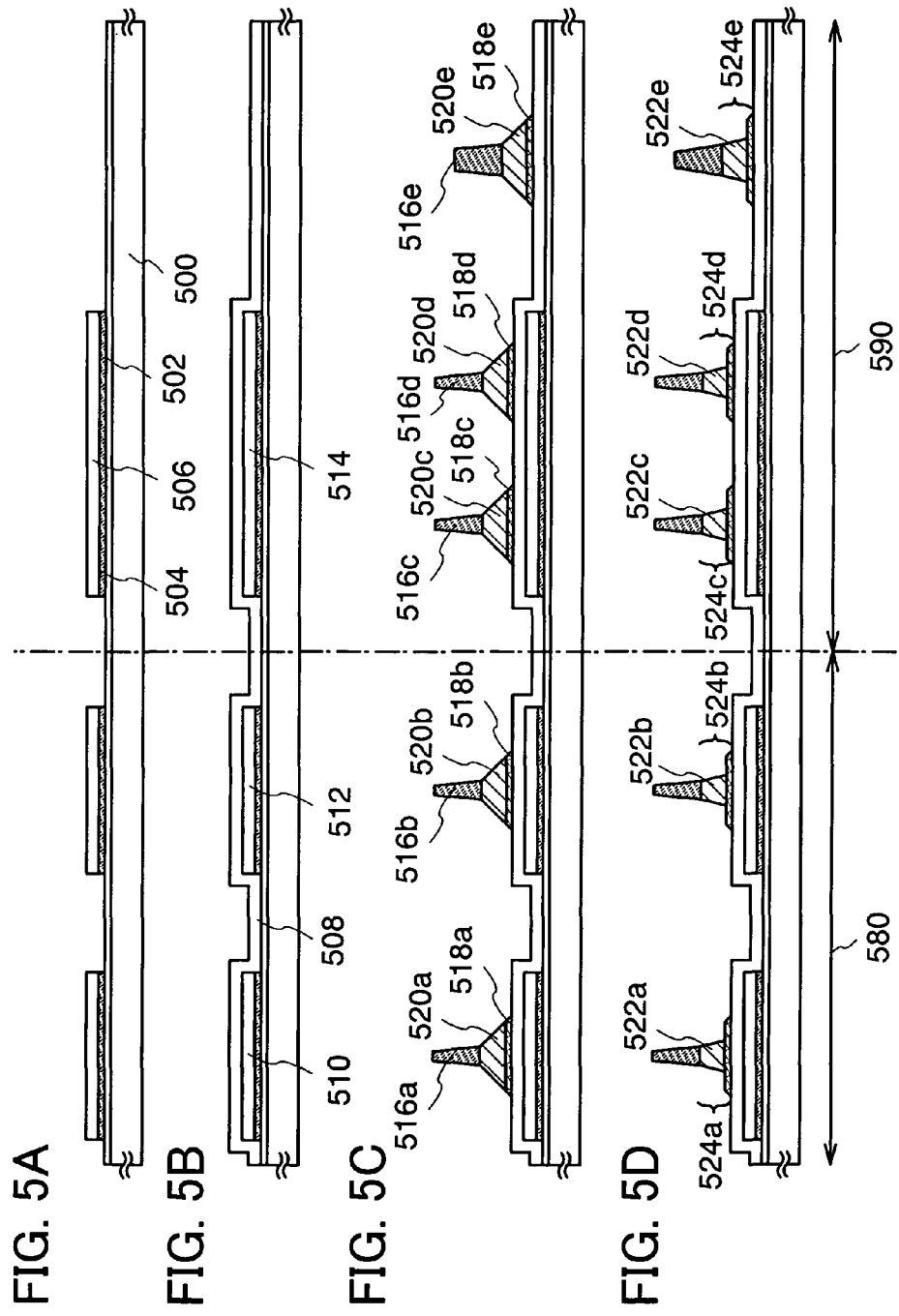

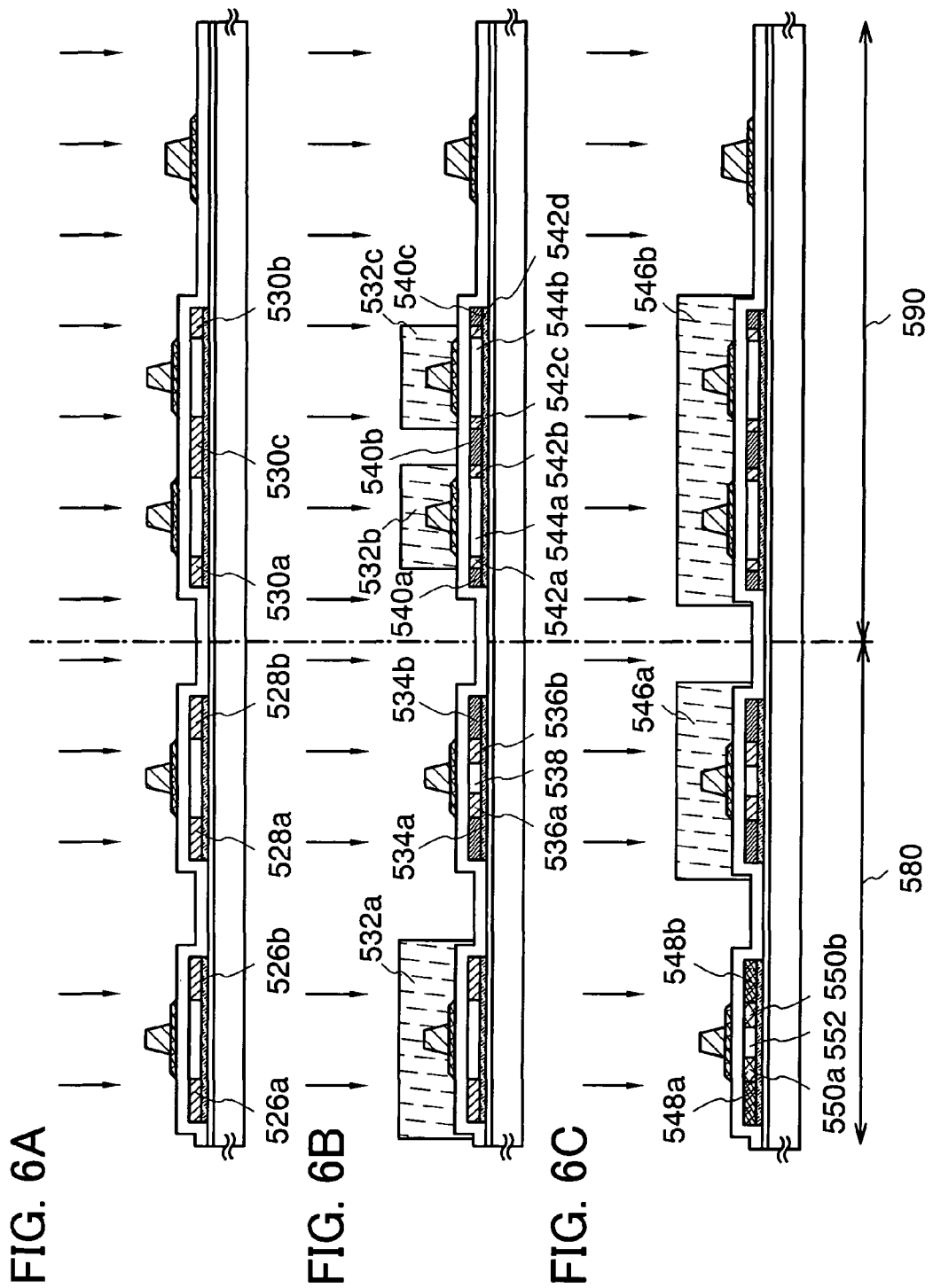

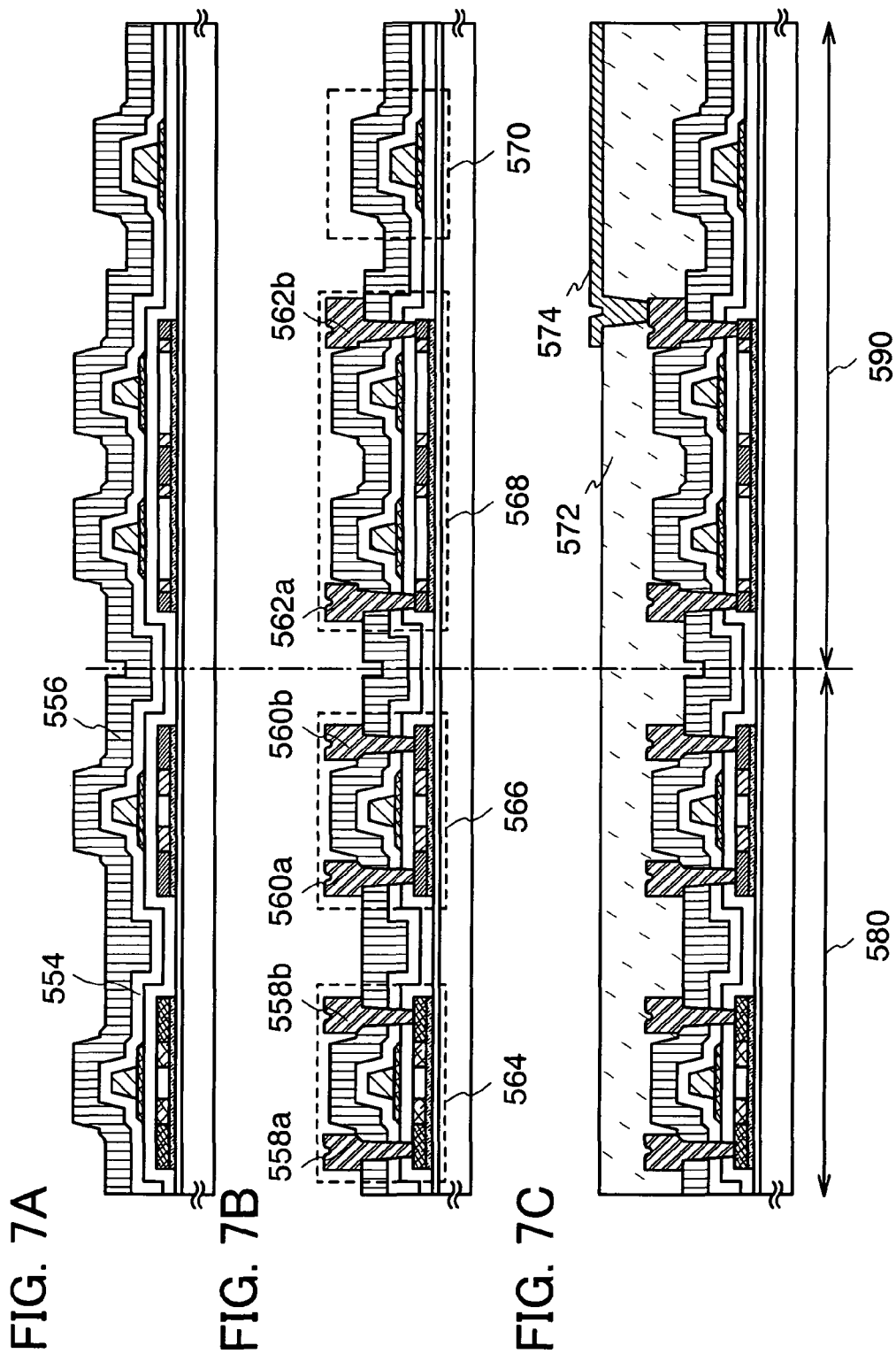

Id-Vg Characteristics

Id-Vg Characteristics

Carrier Mobility

PRIOR ART

SEMICONDUCTOR DEVICE, ELECTRONIC DEVICE AND METHOD FOR MANUFACTURING SEMICONDUCTOR DEVICE

This application is based on Japanese Patent Application serial no. 2007-184984 filed with Japan Patent Office on Jul. 13, 2007, the entire contents which are hereby incorporated by reference.

BACKGROUND OF THE INVENTION

1. Field of the Invention

The present invention relates to a semiconductor device, an electronic device, and a method for manufacturing a semiconductor device.

2. Description of the Related Art

In recent years, flat panel displays such as liquid crystal display devices and electroluminescence (EL) display devices have attracted attention.

Driving methods of the flat panel displays include a passive matrix method and an active matrix method. An active matrix method has advantages over a passive matrix method in low power consumption, high definition, a large-sized substrate, and the like.

Here, a structural example of an active matrix liquid crystal panel is briefly described with reference to FIGS. 15A and 15B. FIG. 15A illustrates an example of a structure in which a driver circuit is provided using a tape automated bonding (TAB) method.

In FIG. 15A, a pixel portion 1501 in which pixels 1502 are arranged in matrix is formed over a substrate 1500 having an insulating surface. The pixels 1502 are arranged in matrix at intersections of scan lines extending from a scan line side input terminal 1503 and signal lines extending from a signal line side input terminal 1504. Each of the pixels in the pixel portion 1501 is provided with a switching element and a pixel electrode layer connected to the switching element. A typical example of the switching element is a TFT. A gate electrode layer side of the TFT is connected to a scan line, and a source or drain side of the TFT is connected to a signal line. In addition, an IC 1551 included in a driver circuit is connected to a flexible printed circuit (FPC) 1550.

In a structure where a driver circuit is provided outside a panel as in FIG. 15A, it is possible to use, as a driver circuit, an IC using a single-crystal silicon; therefore, a problem due to a speed of a driver circuit does not arise. However, when an IC is provided in this manner, the manufacturing cost cannot be reduced sufficiently because of necessity of preparing a panel and an IC separately, necessity of a step of connecting the panel and the IC, and the like. Further, the thickness of the liquid crystal panel is increased when the IC is connected, which leads to increase in the size of a frame region.

In terms of reduction in cost or a panel size, or the like, a method in which a pixel portion and a driver circuit are formed over the same substrate has been employed (e.g., see Patent Document 1: Japanese Published Patent Application No. H8-6053). FIG. 15B illustrates an example of a structure in which a pixel portion and a driver circuit portion are formed over the same substrate.

In the case illustrated in FIG. 15B, non-single-crystal silicon such as amorphous silicon, microcrystalline silicon, or polycrystalline silicon is used as a semiconductor layer of a driver circuit 1560, similar to the pixel portion. However, even in a case where microcrystalline silicon or polycrystalline silicon as well as amorphous silicon is used, there is a problem in that characteristics thereof are incomparable to characteristics of single-crystal silicon. In particular, in a semiconductor layer which is used for a conventional panel where a driver circuit is integrated, characteristics which are necessary and sufficient cannot be obtained. This has caused a big problem in manufacturing a driver circuit, that is, a semiconductor device where high speed operation is required.

In order to solve the above-described problem, a panel using silicon on insulator (SOI) technology is made on an experimental basis in recent years. In particular, when Smart Cut (registered trademark) is used, a single-crystal silicon thin film having high carrier mobility can be obtained by a very simple method (for example, see Patent Document 2: Japanese Published Patent Application No. H11-163363).

SUMMARY OF THE INVENTION

A semiconductor layer which has a characteristic required for a driver circuit can be obtained by the above-described SOI technology. However, a characteristic required for a driver circuit and a characteristic required for a circuit of a pixel portion are not the same; therefore, when the driver circuit and the circuit of the pixel portion are formed using a single-crystal silicon thin film having the same quality, there is a problem in that a panel having both the characteristic required for the driver circuit and the characteristic required for the circuit of the pixel portion cannot be manufactured.

In view of the above-described problem, it is an object of the present invention to provide a semiconductor device having required characteristics and a manufacturing method thereof.

In the present invention, a single-crystal semiconductor layer is formed over a substrate having an insulating surface by low-temperature heat treatment, and then the single-crystal semiconductor layer is irradiated with laser light as selected. Specifically, a region of the single-crystal semiconductor layer to be a circuit of a pixel portion is not irradiated with laser light, a region other than the above region in the single-crystal semiconductor layer is irradiated with laser light. Thus, a semiconductor device in which each circuit has a required characteristic can be manufactured. Note that a method for determining a region of a semiconductor layer which is irradiated with laser light and a region of a semiconductor layer which is not irradiated with laser light is not limited to the above-described way. Only a region to be a driver circuit may be irradiated with laser light.

As a semiconductor device formed using the present invention, a semiconductor device having a light-emitting element in which a light-emitting material is interposed between electrodes (an electroluminescent display device), a semiconductor device using a liquid crystal material as a light shutter (a liquid crystal display device), or the like can be given. Note that a semiconductor device may include only a semiconductor substrate or it may include other components in addition to the semiconductor substrate. For example, a semiconductor device may include a flexible printed circuit (FPC), a printed wiring board (PWB), or the like. Further, it may include an optical sheet such as a polarizing plate or a retardation plate. Note that it may also include a light source such as a backlight. Note that in this specification, a substrate having a semiconductor material is referred to as a semiconductor substrate.

According to one feature of a method for manufacturing a semiconductor device of the present invention, a single-crystal semiconductor layer is formed over a substrate having an insulating surface; a region of the single-crystal semiconductor layer is irradiated with laser light; a circuit of a pixel portion is formed using a region of the single-crystal semiconductor layer which is not irradiated with the laser light; and a driver circuit for driving the circuit of the pixel portion is formed using the region of the single-crystal semiconductor layer which is irradiated with the laser light.

According to another feature of a method for manufacturing a semiconductor device of the present invention, a damaged region is formed at a predetermined depth from a surface of a single-crystal semiconductor substrate; an insulating layer is formed over the single-crystal semiconductor substrate; the single-crystal semiconductor substrate is bonded to a substrate having an insulating surface with the insulating layer interposed therebetween; the single-crystal semiconductor substrate is separated at the damaged region to form a single-crystal semiconductor layer over the substrate having an insulating surface; a region of the single-crystal semiconductor layer is irradiated with laser light; a circuit of a pixel portion is formed using a region of the single-crystal semiconductor layer which is not irradiated with the laser light; and a driver circuit for driving the circuit of the pixel portion is formed using the region of the single-crystal semiconductor layer which is irradiated with the laser light.

According to another feature of a method for manufacturing a semiconductor device of the present invention, a damaged region is formed at a predetermined depth from a surface of a single-crystal semiconductor substrate; an insulating layer is formed over a substrate having an insulating surface; the single-crystal semiconductor substrate is bonded to the substrate having an insulating surface with the insulating layer interposed therebetween; the single-crystal semiconductor substrate is separated at the damaged region to form a single-crystal semiconductor layer over the substrate having an insulating surface; a region of the single-crystal semiconductor layer is irradiated with laser light; a circuit of a pixel portion is formed using a region of the single-crystal semiconductor layer which is not irradiated with the laser light; and a driver circuit for driving the circuit of the pixel portion is formed using the region of the single-crystal semiconductor layer which is irradiated with the laser light.

In the above description, the insulating layer is preferably formed by a chemical vapor deposition method using an organic silane gas.

According to another feature of a method for manufacturing a semiconductor device of the present invention, a damaged region is formed at a predetermined depth from a surface of a single-crystal semiconductor substrate; a first insulating layer is formed over the single-crystal semiconductor substrate; a second insulating layer is formed over the first insulating layer; the single-crystal semiconductor substrate and the first insulating layer are bonded to a substrate having an insulating surface with the second insulating layer interposed therebetween; the single-crystal semiconductor substrate is separated at the damaged region to form a single-crystal semiconductor layer over the substrate having an insulating surface; a region of the single-crystal semiconductor layer is irradiated with laser light; a circuit of a pixel portion is formed using a region of the single-crystal semiconductor layer which is not irradiated with the laser light; and a driver circuit for driving the circuit of the pixel portion is formed using the region of the single-crystal semiconductor layer which is irradiated with the laser light.

According to another feature of a method for manufacturing a semiconductor device of the present invention, a damaged region is formed at a predetermined depth from a surface of a single-crystal semiconductor substrate; a first insulating layer is formed over the single-crystal semiconductor substrate; a second insulating layer is formed over a substrate having an insulating surface; the single-crystal semiconductor substrate and the first insulating layer are bonded to the substrate having an insulating surface with the second insulating layer interposed therebetween; the single-crystal semiconductor substrate is separated at the damaged region to form a single-crystal semiconductor layer over the substrate having an insulating surface; a region of the single-crystal semiconductor layer is irradiated with laser light; a circuit of a pixel portion is formed using a region of the single-crystal semiconductor layer which is not irradiated with the laser light; and a driver circuit for driving the circuit of the pixel portion is formed using the region of the single-crystal semiconductor layer which is irradiated with the laser light.

In the above description, the first insulating layer may be formed after forming the damaged region. Alternatively, the damaged region may be formed after forming the first insulating layer.

In the above description, the first insulating layer may have a stacked-layer structure. Further, the first insulating layer may have a stacked-layer structure of a silicon oxynitride layer and a silicon nitride oxide layer. The silicon oxynitride layer may be formed so as to be in contact with the single-crystal semiconductor substrate. The second insulating layer is preferably formed by a chemical vapor deposition method using an organic silane gas.

Further, in the above description, after performing heat treatment without laser light irradiation, laser light irradiation may be performed.

According to one feature of the present invention, a semiconductor device includes a substrate having an insulating surface; a first single-crystal semiconductor layer which is irradiated with laser light over the substrate having an insulating surface; and a second single-crystal semiconductor layer which is not irradiated with laser light over the substrate having an insulating surface. In the semiconductor device, a circuit of a pixel portion is formed using the second single-crystal semiconductor layer, and a driver circuit for driving the circuit of the pixel portion is formed using the first single-crystal semiconductor layer.

According to another feature of the present invention, a semiconductor device includes a substrate having an insulating surface; an insulating layer over the substrate having an insulating surface; a first single-crystal semiconductor layer which is irradiated with laser light over the insulating layer; and a second single-crystal semiconductor layer which is not irradiated with laser light over the substrate having an insulating surface. In the semiconductor device, a circuit of a pixel portion is formed using the second single-crystal semiconductor layer, and a driver circuit for driving the circuit of the pixel portion is formed using the first single-crystal semiconductor layer.

According to another feature of the present invention, a semiconductor device includes a substrate having an insulating surface; a first insulating layer over the substrate having an insulating surface; a second insulating layer over the first insulating layer; a first single-crystal semiconductor layer which is irradiated with laser light over the second insulating layer; and a second single-crystal semiconductor layer which is not irradiated with laser light over the substrate having an insulating surface. In the semiconductor device, a circuit of a pixel portion is formed using the second single-crystal semiconductor layer, and a driver circuit for driving the circuit of the pixel portion is formed using the first single-crystal semiconductor layer.

In the above description, the second insulating layer may have a stacked-layer structure. Further, the second insulating layer may have a stacked-layer structure of a silicon oxynitride layer and a silicon nitride oxide layer. The silicon oxynitride layer may be in contact with the single-crystal semiconductor layer.

Further, in the above description, a full width at half maximum of a Raman peak of the region of a single-crystal semiconductor layer which is irradiated with laser light is greater than or equal to 2.5 cm$^{-1}$ and less than or equal to 3.5 cm$^{-1}$. On the other hand, a full width at half maximum of a Raman peak of the region of a single-crystal semiconductor layer which is not irradiated with laser light is greater than 3.5 cm$^{-1}$. The peak wavenumber of a Raman peak of the region which is irradiated with laser light is greater than or equal to 520.0 cm$^{-1}$ and less than or equal to 521.0 cm$^{-1}$. On the other hand, the peak wavenumber of a Raman peak of the region which is not irradiated with laser light is less than 520.0 cm$^{-1}$.

A subthreshold swing (S value) of a semiconductor device (a transistor) manufactured using a region of a single-crystal semiconductor layer which is irradiated with laser light is less than or equal to half of that of a semiconductor device (a transistor) manufactured using a region of a single-crystal semiconductor layer which is not irradiated with laser light.

Further, various electronic devices can be provided using the above-described semiconductor devices.

By using a manufacturing method of the present invention, a driver circuit using a single-crystal semiconductor layer having necessary and sufficient characteristics can be manufactured at reduced cost. Accordingly, a complete monolithic semiconductor device can be manufactured; therefore, thickening which results from connecting an IC to a panel can be prevented. Moreover, a semiconductor device in which an area of a frame portion is reduced can be manufactured. Further, according to the present invention, a high-performance semiconductor device can be manufactured using a substrate having low heat resistance such as a glass substrate.

Further, by using a manufacturing method of the present invention, a semiconductor device using a single-crystal semiconductor layer which is suitable for a peripheral driver circuit region and a single-crystal semiconductor layer which is suitable for a pixel region can be provided. A semiconductor device with less variation in luminance among pixels can be obtained by forming a pixel region using a single-crystal semiconductor layer which is not irradiated with laser light, as compared to a case where a pixel region is formed using a single-crystal semiconductor layer which is irradiated with laser light. Further, when the peripheral circuit region is formed using a single-crystal semiconductor layer which is irradiated with laser light, a driver circuit, or the like can be operated at high speed.

BRIEF DESCRIPTION OF THE DRAWINGS

In the accompanying drawings:

FIGS. 5A to 5D are views illustrating a manufacturing process of a semiconductor device in connection with an Embodiment Mode of the present invention;

FIGS. 6A to 6C are views illustrating a manufacturing process of a semiconductor device in connection with an Embodiment Mode of the present invention;

FIGS. 7A to 7C are views illustrating a manufacturing process of a semiconductor device in connection with an Embodiment Mode of the present invention;

DETAILED DESCRIPTION OF THE INVENTION

Figure 1A:
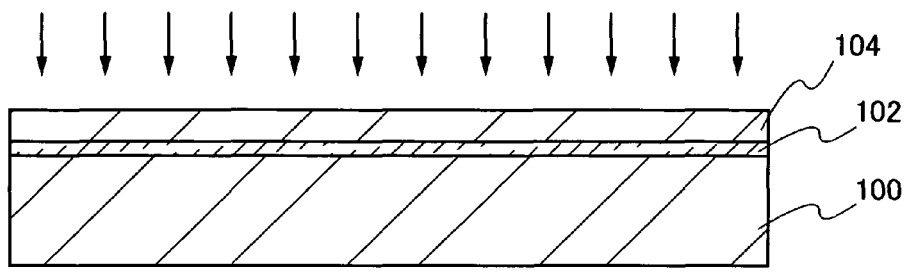
FIGS. 1A to 1D are views illustrating a manufacturing process of a semiconductor substrate in connection with an Embodiment Mode of the present invention.

Embodiment modes of the present invention will be hereinafter described with reference to the drawings. However, the present invention is not limited to descriptions below, and it is easily understood by those skilled in the art that modes and details can be modified in various ways without departing from the purpose and the scope of the present invention. Therefore, unless such changes and modifications depart from the purport and the scope of the present invention, they should be construed as being included therein. Note that reference numerals denoting the identical portions are the same in all figures.

Embodiment Mode 1

This embodiment mode will describe an example of a manufacturing method of a semiconductor substrate used for a semiconductor device of the present invention with reference to FIGS. 1A to 1D, FIGS. 2A to 2C, and FIGS. 3A and 3B.

First, a single-crystal semiconductor substrate 100 is prepared. Then, the ions are introduced at a predetermined depth from the surface of the single-crystal semiconductor substrate 100 to form a damaged region 102 and a single-crystal semiconductor layer 104 (see FIG. 1A). As a method for forming the damaged region 102, a method used for adding an impurity element to a semiconductor layer (an ion doping method), a method for performing mass separation of an ionized gas to be selectively implanted into a semiconductor layer (an ion implantation method), and the like can be given. Ion irradiation may be performed in consideration of the thickness of the single-crystal semiconductor layer 104 which is formed. The thickness of the single-crystal semiconductor layer 104 may be approximately 5 to 500 nm, and 10 to 200 nm is more preferable. An accelerating voltage at ion irradiation can be determined in consideration of the above-described thickness.

The single-crystal semiconductor substrate 100 is not particularly limited as long as it is a substrate made of a single-crystal semiconductor material, and a single-crystal silicon substrate can be used, as an example. Alternatively, a germanium substrate or a substrate made of a compound semiconductor such as gallium arsenide or indium phosphide can be applied.

As the above-described ions, ions of hydrogen, helium, halogen typified by fluorine, and the like can be used. When fluorine ion is used as halogen ions, $BF_3$ may be used as a source gas. For example, when a single-crystal silicon substrate is used as the single-crystal semiconductor substrate 100 and halogen ions like fluorine ions are introduced into the single-crystal silicon substrate, microvoids are formed in the damaged region 102. This is because the introduced halogen ion purges silicon atoms in a silicon crystal lattice. The volumes of the microvoids thus formed are changed, so that the single-crystal silicon substrate can be separated. Specifically, the volume change of the microvoids is induced by low-temperature heat treatment. Note that hydrogen ion irradiation may be performed to contain hydrogen in the voids after fluorine ion irradiation is performed.

Alternatively, the single-crystal silicon substrate may be irradiated with a plurality of ions of the same atom, in which the mass numbers are different. For example, hydrogen ion irradiation can be performed by using $H^+$, $H_2^+$, and $H_3^+$ ions, and it is preferable that the proportion of $H_3^+$ ions is increased. Increase in the proportion of $H_3^+$ ions results in increase in the ion irradiation efficiency; thus, the ion irradiation time can be shortened.

Ion irradiation is performed at a high dose in forming the damaged region 102; therefore, there is a case where the surface of the single-crystal semiconductor layer 104 is roughened. In order to prevent this, a protective film may be provided on a surface which is irradiated with ions. The protective film can be formed using silicon nitride or silicon nitride oxide. The thickness of the protective film is preferably approximately 50 nm to 200 nm.

Figure 1B:
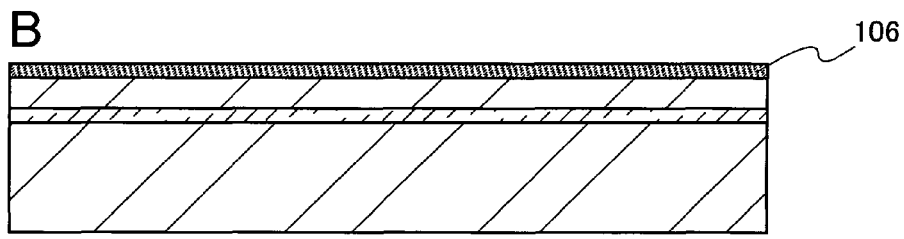

Next, a bonding layer 106 is formed over a surface of the single-crystal semiconductor layer 104 that is to form a bond with a substrate having an insulating surface (see FIG. 1B). As the bonding layer 106, a silicon oxide film may be formed by a chemical vapor deposition method using an organic silane gas. Alternatively, a silicon oxide film formed by a chemical vapor deposition method using a silane gas can be applied. In the case of using a chemical vapor deposition method, it is necessary to perform deposition under a temperature condition in which degasification does not occur from the damaged region 102. Note that as to heat treatment for separating the single-crystal semiconductor layer 104 from the single-crystal semiconductor substrate 100, a temperature higher than a deposition temperature is applied. Further, since the bonding layer 106 is formed with an insulating material, the bonding layer 106 can also be referred to as an insulating layer.

The bonding layer 106 is formed to be smooth and has a hydrophilic surface. A silicon oxide film is appropriate as the bonding layer 106. In particular, a silicon oxide film which is formed by a chemical vapor deposition method using an organic silane gas is preferable. As an organic silane gas, silicon-containing compounds, such as tetraethoxysilane (TEOS) (chemical formula: $Si(OC_2H_5)_4$), trimethylsilane (TMS) (chemical formula: $(CH_3)_3SiH$), tetramethylsilane (chemical formula: $(CH_3)_4Si$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$) can be used.

The above-described bonding layer 106 is provided with a thickness of approximately 5 to 500 nm. With such a thickness, it is possible to smooth a surface of the bonding layer 106 and also to ensure smoothness of a growth surface of the bonding layer 106. Further, it is possible to mitigate distortion with a substrate to be bonded. Note that a substrate 110 having an insulating surface used in a subsequent step can also be provided with a similar bonding layer. The single-crystal semiconductor substrate 100 and the substrate 110 having an insulating surface can be strongly bonded together by thus forming a silicon oxide film using organic silane as a material for one or both of surfaces that are to form a bond.

Note that a nitrogen-containing insulating layer may be provided between the single-crystal semiconductor layer 104 and the bonding layer 106. The nitrogen-containing insulating layer can be formed using one or a plurality of materials selected from silicon nitride, silicon nitride oxide, or silicon oxynitride. Note that the nitrogen-containing insulating layer may have a single-layer structure or a stacked-layer structure. For example, a silicon oxynitride film and a silicon nitride oxide film can be stacked from a side of the single-crystal semiconductor layer 104 to obtain the nitrogen-containing insulating layer. The nitrogen-containing insulating layer is provided to prevent intrusion of impurities such as movable ions like alkali metal or alkaline earth metal or moisture into the single-crystal semiconductor layer 104. Note that an insulating layer other than the nitrogen-containing insulating layer may be provided as long as intrusion of impurities can be prevented.

Here, a silicon oxynitride film shows a film in which content of oxygen is larger than that of nitrogen and is exemplified by a film which includes oxygen, nitrogen, silicon, and hydrogen at concentrations ranging from greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0.1 at. % and less than or equal to 10 at. %, respectively. Further, a silicon nitride oxide film shows a film that has greater content of nitrogen than that of oxygen and includes oxygen, nitrogen, silicon, and hydrogen at concentrations ranging from greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 25 at. %, respectively. Note that the above-described ranges are obtained by using Rutherford backscattering spectrometry (RBS) or hydrogen forward scattering (HFS). Moreover, the total for the content ratio of the constituent elements does not exceed 100 at. %.

Note that in this embodiment mode, ion irradiation is performed and then the bonding layer 106 is provided; however, the present invention is not limited to this structure. As long as the strength of the bond can be kept above a certain value, a structure may be employed in which the bonding layer 106 is formed and then ion irradiation is performed. As to the case of providing the nitrogen-containing insulating layer, the nitrogen-containing insulating layer may be provided before or after ion irradiation, in a similar manner. When the nitrogen-containing insulating layer is provided before ion irradiation, increase in surface roughness of the single-crystal semiconductor substrate 100 due to ion irradiation can be prevented.

Figure 1C:
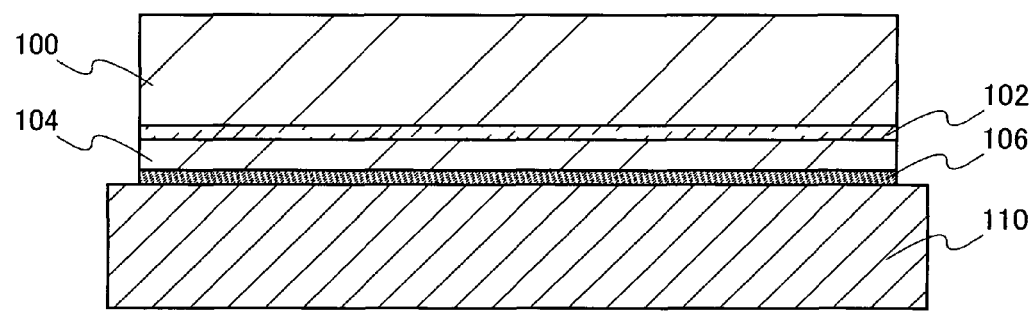

Next, the substrate 110 having an insulating surface and the bonding layer 106 are disposed in close contact with each other (see FIG. 1C). The substrate 110 having an insulating surface and the bonding layer 106 are disposed in close contact with each other and pressure is applied therebetween, so that the substrate and the bonding layer can be bonded firmly to each other by hydrogen bonds and covalent bonds. Note that it is preferable to perform heat treatment after the substrate 110 having an insulating surface and the single-crystal semiconductor substrate 100 are bonded to each other, with the bonding layer 106 interposed therebetween. The bonding strength can be further enhanced by performing heat treatment.

In order to form a favorable bond, the surface that is to form a bond may be activated. For example, the surface that is to form a bond is irradiated with an atomic beam or an ion beam. When an atomic beam or an ion beam is used, an inert gas atomic beam or inert gas ion beam of argon or the like can be used. Alternatively, plasma treatment or radical treatment is performed. Such surface treatment makes it possible to form a bond between different kinds of materials at a low temperature of approximately from 200 to 400° C.

As the substrate 110 having an insulating surface, any of a variety of glass substrates which are used in the electronics industry such as an aluminosilicate glass substrate, an aluminoborosilicate glass substrate, and a barium borosilicate glass substrate; a quartz substrate; a ceramic substrate; a sapphire substrate; or the like can be used. A glass substrate is preferably used, and a mother glass substrate having a large area can be used, such as a so-called sixth generation substrate (1500 mm×1850 mm), a so-called seventh generation substrate (1870 mm×2200 mm), and a so-called eighth generation substrate (2200 mm×2400 mm), for example. A mother glass substrate having a large area is used as the substrate 110 having an insulating surface, so that the area of the semiconductor substrate can be enlarged. Note that the substrate 110 having an insulating surface is not limited to the above-described substrates. For example, a substrate made from a resin material can also be used as long as the substrate has an allowable temperature limit.

Figure 1D:
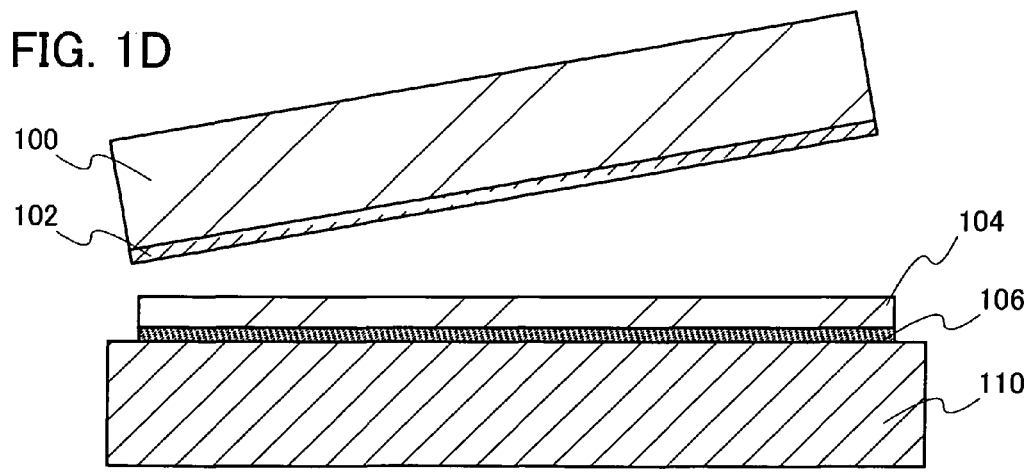

Next, heat treatment is performed to separate the single-crystal semiconductor layer 104 from the single-crystal semiconductor substrate 100 with the damaged region 102 used as a separation plane (see FIG. 1D). For example, heat treatment is performed at 400 to 600° C., so that the volume change of the microvoids which are formed in the damaged region 102 is induced; accordingly, the single-crystal semiconductor layer 104 can be separated. Since the bonding layer 106 is bonded to the substrate 110 having an insulating surface, the single-crystal semiconductor layer 104 having the same crystallinity as that of the single-crystal semiconductor substrate 100 remains over the substrate 110 having an insulating surface.

When a glass substrate is used as the substrate 110 having an insulating surface, heat treatment may be performed approximately at a strain point of a glass substrate, specifically at a temperature in a range from minus 50° C. to plus 50° C. of the strain point. More specifically, heat treatment may be performed at a temperature greater than or equal to 580° C. and less than or equal to 680° C. Note that a glass substrate has a property of contraction by heat. Therefore, when a glass substrate is heated approximately at a strain point, specifically at a temperature in a range from minus 50° C. to plus 50° C. of the strain point (or higher) in advance, contraction in subsequent heat treatment can be suppressed. Accordingly, even when heat treatment is performed on a glass substrate, to which a single-crystal semiconductor layer having a thermal expansion coefficient different from that of the glass substrate is bonded, separation of the single-crystal semiconductor layer from the glass substrate can be prevented. Further, transformation such as a warp of the glass substrate and the single-crystal semiconductor layer can be prevented.

Note that when a glass substrate is used, it is preferable to avoid rapid cooling at the termination of heating. Specifically, the glass substrate may be cooled down to a temperature less than or equal to a strain point at a speed of less than or equal to 2° C./min, preferably less than or equal to 0.5° C./min, more preferably less than or equal to 0.3° C./min. The temperature reduction rate is reduced, so that local stress which is applied when the glass substrate is contracted can be eased. The heat treatment may be performed under atmospheric pressure or under reduced pressure. As to an atmosphere, a nitrogen atmosphere, an oxygen atmosphere, or the like can be set, as appropriate. Note that the heat treatment can be performed on any other substrates without limitation to a glass substrate, as long as a substrate having a property of contraction after heating is used.

Note that heat treatment related to the bonding step and heat treatment related to the separation step can be performed simultaneously. In this case, two steps can be performed with single heat treatment; therefore, a semiconductor substrate can be manufactured at low cost.

The surface of the single-crystal semiconductor layer 104 obtained through the above-described process is preferably subjected to chemical mechanical polishing (CMP) for planarization. By improving planarity of the single-crystal semiconductor layer 104, variation in element characteristics in circuits to be formed later can be suppressed. Note that a CMP step may be omitted if desired characteristics can be obtained.

Next, a case in which the bonding layer 106 is provided for a side of the substrate 110 having an insulating surface will be described with reference to FIGS. 2A to 2C.

Figure 2A:
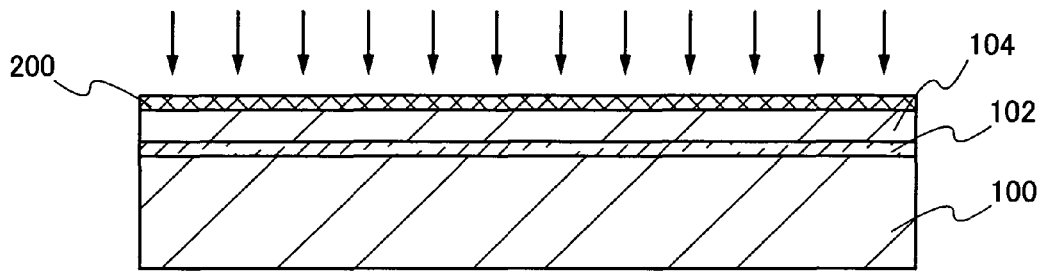
FIGS. 2A to 2C are views illustrating a manufacturing process of a semiconductor substrate in connection with an Embodiment Mode of the present invention.

First, a silicon oxide film 200 is formed over the single-crystal semiconductor substrate 100 and the damaged region 102 and the single-crystal semiconductor layer 104 are formed (see FIG. 2A). Since ion irradiation can be carried out similarly to the case illustrated in FIG. 1A, description thereof is omitted. By forming the silicon oxide film 200 over a surface of the single-crystal semiconductor substrate 100, damage to the surface of the single-crystal semiconductor substrate 100 due to ion irradiation can be prevented. That is, planarity of the surface of the single-crystal semiconductor substrate 100 can be maintained.

Figure 2B:
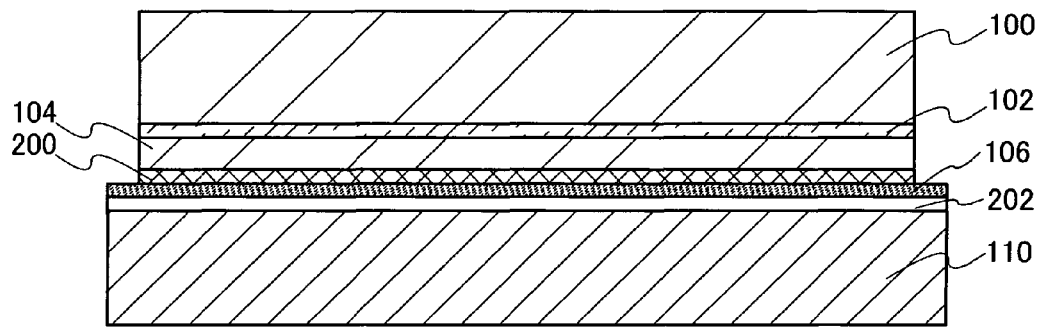

Next, the substrate 110 having an insulating surface over which a barrier layer 202 and the bonding layer 106 are formed; and the single-crystal semiconductor substrate 100 are disposed in close contact with each other (see FIG. 2B). Specifically, the bonding layer 106 and the silicon oxide film 200 are disposed in close contact with each other to be bonded together. Note that the barrier layer 202 is provided to prevent an impurity such as alkali metal or an alkaline earth metal from entering the single-crystal semiconductor layer 104. When the entering of an impurity into the single-crystal semiconductor layer 104 from the substrate 110 having an insulating surface is not a problem, a structure may be employed in which the barrier layer 202 is not provided.

The barrier layer 202 can be formed using one or a plurality of materials selected from silicon oxide, silicon nitride, silicon nitride oxide, silicon oxynitride, or the like. The barrier layer 202 may have a single-layer structure or a stacked-layer structure. Note that a material of the barrier layer 202 is not limited to the above-described materials as long as the barrier layer 202 can prevent an impurity from entering the single-crystal semiconductor layer 104.

Figure 2C:
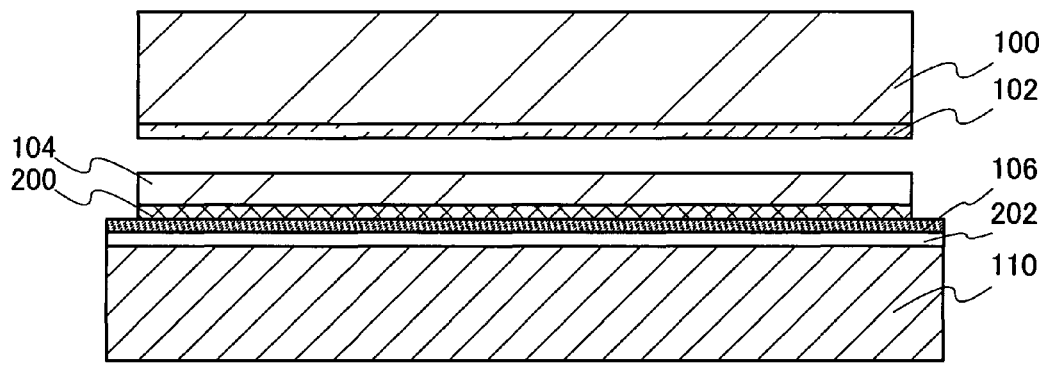

After that, the single-crystal semiconductor substrate 100 is separated (see FIG. 2C). Since heat treatment in separation of the single-crystal semiconductor substrate 100 can be performed similarly to the case illustrated in FIG. 1D, description thereof is omitted. Thus, a semiconductor substrate illustrated in FIG. 2C can be obtained.

Next, a treatment for recovering characteristics of the single-crystal semiconductor layer 104 manufactured through the above-described process will be described with reference to FIGS. 3A and 3B. In the above-described process, the single-crystal semiconductor layer 104 is separated at the damaged region 102. The single-crystal semiconductor layer 104 is damaged by ion irradiation in forming the damaged region 102. Therefore, the single-crystal semiconductor layer cannot offer performance sufficiently. In view of the problem, in the present invention, characteristics of the single-crystal semiconductor layer 104 are recovered by irradiating the single-crystal semiconductor layer 104 with laser light. Note that a treatment for recovering characteristics of the single-crystal semiconductor layer 104 manufactured by the method illustrated in FIGS. 1A to 1D will be described for simplification; however, the present invention is not limited thereto. The treatment for recovering characteristics of the single-crystal semiconductor layer 104 can be applied for the single-crystal semiconductor layer 104 manufactured by the method illustrated in FIGS. 2A to 2C; and single-crystal semiconductor layers manufactured by other methods.

Figure 3A:
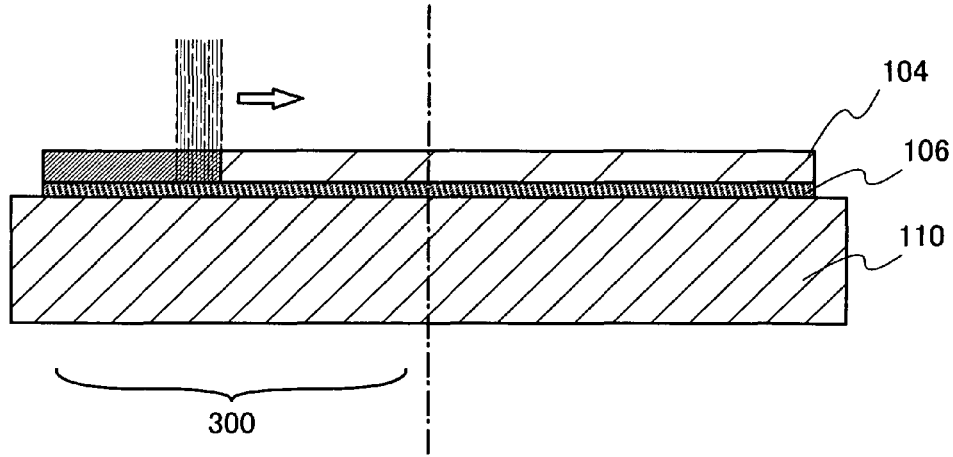
FIGS. 3A and 3B are views illustrating a manufacturing process of a semiconductor substrate in connection with an Embodiment Mode of the present invention.
Figure 3B:
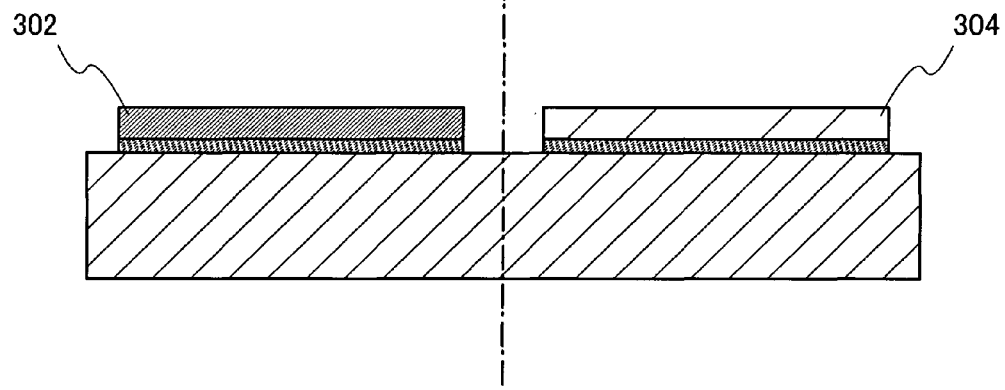

First, only a region 300 that is part of the single-crystal semiconductor layer 104 is irradiated with laser light (see FIG. 3A). As to the laser light irradiation, a continuous-wave laser (a CW laser), a pseudo-CW laser (a pulsed laser, the repetition rate of which is greater than or equal to 10 MHz, preferably greater than or equal to 80 MHz), or the like can be used, for example.

Specifically, as the CW laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti: sapphire laser, a helium cadmium laser, or the like can be used.

As the pseudo-CW laser, a pulsed laser such as an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti: sapphire laser, a copper vapor laser, or a gold vapor laser can be used. Such a pulsed laser can be treated in the same manner as that of a CW laser, as the repetition rate is increased.

Here, only the region of the single-crystal semiconductor layer 104 is irradiated with laser light in order to provide single-crystal semiconductor layers which have characteristics of respective circuits to be manufactured later. For example, since a transistor in a driver circuit needs high-speed operation, the region 300 in which characteristics are improved by laser light irradiation is preferably used for the transistor in the driver circuit. On the other hand, a transistor in a pixel portion needs less variation rather than high-speed operation. This is because variation in characteristics among pixels means variation in luminance among the pixels.

As to laser light irradiation, there are many parameters such as output which changes with time, homogeneity of laser light, or the like, that are difficult to be controlled. As long as these parameters that are difficult to be controlled exist, intended laser light irradiation is difficult. That is, as long as laser light irradiation is performed, a certain degree of variations must be allowed. Accordingly, in the present invention, laser light irradiation is performed on a semiconductor layer for forming a circuit in which variations can be allowed and laser light irradiation is not performed on a semiconductor layer for forming a circuit in which variation will cause a serious problem. More specifically, laser light irradiation is not performed on a region of a pixel portion in a display device and laser light irradiation is performed on the other regions (e.g. a driver circuit, and the like). Thus, a semiconductor substrate having single-crystal semiconductor layers each of which has its required characteristic can be manufactured.

Note that, as a method for selective irradiation with laser light, a method in which only a necessary portion is irradiated with laser light of which irradiation region is narrow, as selected; a method in which a metal mask is provided over the single-crystal semiconductor layer 104 and then a region which is irradiated with laser light and a region which is not irradiated with laser light are determined and formed; a method in which a film serving as a mask (a mask film) for laser light is formed over the single-crystal semiconductor layer 104 and is then patterned to select a region which is irradiated with laser light and a region which is not irradiated with laser light; or the like, can be given. When laser light of which irradiation region is narrow is used, provision of the metal mask and formation of the mask film are not necessary; therefore, the process can be simplified. In a method in which a metal mask or a mask film is formed, an entire surface of the single-crystal semiconductor layer 104 can be irradiated with laser light, which leads to improvement in throughput. When a mask is used, accuracy of the irradiation position of laser light can be improved.

Next, the single-crystal semiconductor layer 104 is patterned to have a desired island shape. At this time, the region 300 which is irradiated with laser light and the other region are divided (see FIG. 3B). Thus, a semiconductor substrate having a single-crystal semiconductor layer 302 which is irradiated with laser light and a single-crystal semiconductor layer 304 which is not irradiated with laser light is completed. Note that, in FIGS. 3A and 3B, patterning is performed after laser light irradiation; however, the present invention is not limited thereto. Needless to say, laser light irradiation may be performed after patterning.

Embodiment Mode 2

In this embodiment mode, another example of a method for manufacturing a semiconductor substrate of the present invention will be described with reference to FIGS. 4A to 4C.

Note that, since steps up to and including the step of FIG. 1D (or FIG. 2C) are similar to that described in Embodiment Mode 1, the description thereof is omitted. Here, a single-crystal semiconductor layer 104 manufactured by the method illustrated in FIGS. 1A to 1D is used for simplification; however, the present invention is not limited to this. A single-crystal semiconductor layer 104 manufactured by the method illustrated in FIGS. 2A to 2C and single-crystal semiconductor layers manufactured by other methods can also be applied.

First, a single-crystal semiconductor layer 104 is formed over a substrate 110 having an insulating surface in accordance with the process described in Embodiment Mode 1 (see FIG. 1D).

Figure 4A:
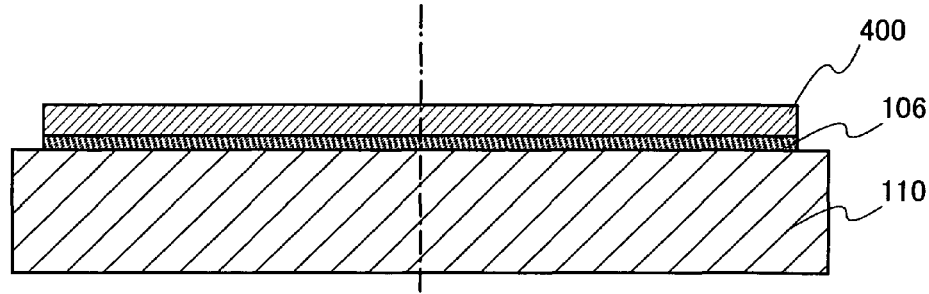
FIGS. 4A to 4C are views illustrating a manufacturing process of a semiconductor substrate in connection with an Embodiment Mode of the present invention.

Next, heat treatment is performed on the single-crystal semiconductor layer 104 (see FIG. 4A). When the single-crystal semiconductor layer 104 is manufactured in accordance with the process described in Embodiment Mode 1, the single-crystal semiconductor layer 104 is damaged due to ion irradiation. Therefore, it is difficult to offer original characteristics of the single-crystal semiconductor layer. In view of the problem, in this embodiment mode, heat treatment is performed on the single-crystal semiconductor layer 104 to form a single-crystal semiconductor layer 400 in which damage due to ion irradiation is recovered.

Heating temperature at this time may be determined in accordance with an upper temperature limit of the substrate 110 having an insulating surface. For example, when a glass substrate is used as the substrate 110 having an insulating surface, heat treatment may be performed approximately at a strain point of a glass substrate, specifically at a temperature in a range from minus 50° C. to plus 50° C. of the strain point, that is, at a temperature greater than or equal to 580° C. and less than or equal to 680° C. When heat treatment is performed on a glass substrate at a temperature of approximately 600° C., damage of the single-crystal semiconductor layer 104 can be recovered by performing heat treatment for greater than or equal to 1 hour. Note that the heat treatment may be performed by a rapid thermal annealing (RTA) method such as a gas rapid thermal annealing (GRTA) method. Here, a GRTA method is a method for performing heat treatment using a high-temperature gas.

Note that variation in characteristics due to heat treatment is sufficiently less than that in laser light irradiation. Therefore, heat treatment is preferably performed on an entire surface of the single-crystal semiconductor layer 104 to recover damage of the single-crystal semiconductor layer 104.

Figure 4B:
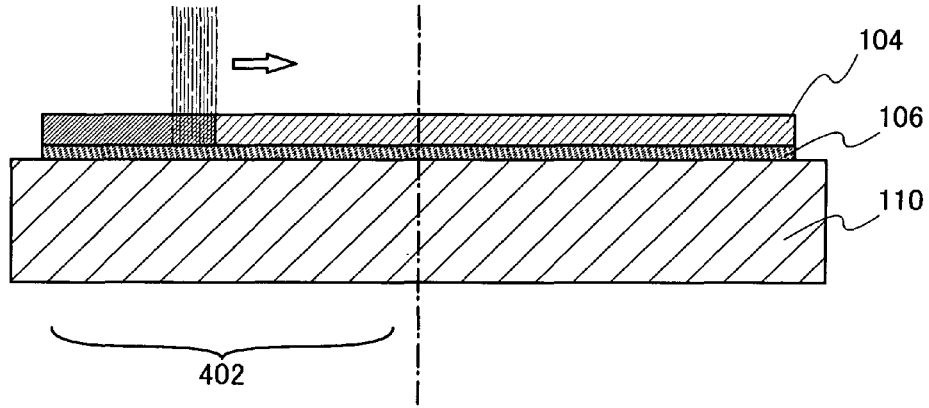
Figure 4C:
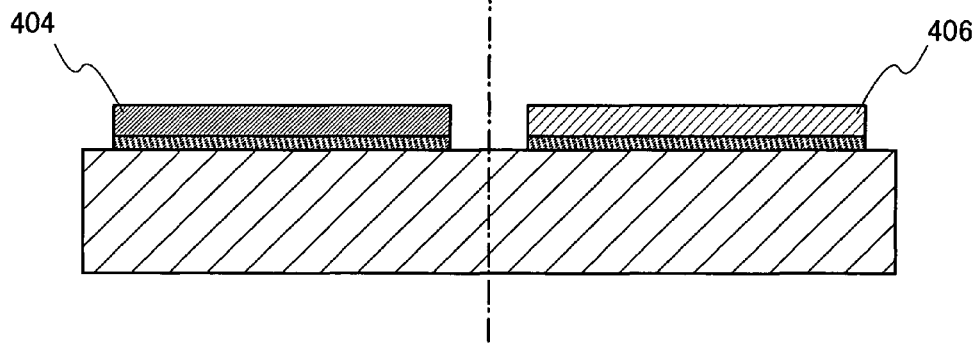

Next, only a region 402 of the single-crystal semiconductor layer 400 is irradiated with laser light (see FIG. 4B). As to the laser light irradiation, a continuous-wave laser (a CW laser), a pseudo-CW laser (a pulsed laser, the repetition rate of which is greater than or equal to 10 MHz, preferably greater than or equal to 80 MHz), or the like can be used, for example.

Specifically, as the CW laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti: sapphire laser, a helium cadmium laser, or the like can be used.

As the pseudo-CW laser, a pulsed laser such as an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti: sapphire laser, a copper vapor laser, or a gold vapor laser can be used. Such a pulsed laser can be treated in the same manner as that of a CW laser, as the repetition rate is increased.

Here, only the region of the single-crystal semiconductor layer 400 is irradiated with laser light in order to provide single-crystal semiconductor layers which have characteristics of respective circuits to be manufactured later. For example, since a transistor in a driver circuit needs high-speed operation, the region 402 in which characteristics are improved by laser light irradiation is preferably used for the transistor in the driver circuit. On the other hand, a transistor in a pixel portion needs less variation rather than high-speed operation. This is because variation in characteristics among pixels means variation in luminance among the pixels.

As to laser light irradiation, there are many parameters such as output which changes with time, homogeneity of laser light, or the like, that are difficult to be controlled. As long as these parameters that are difficult to be controlled exist, intended laser light irradiation is difficult. That is, as long as laser light irradiation is performed, a certain degree of variations must be allowed. Accordingly, in the present invention, laser light irradiation is performed on a semiconductor layer for forming a circuit in which variations can be allowed and laser light irradiation is not performed on a semiconductor layer for forming a circuit in which variation will cause a serious problem. More specifically, laser light irradiation is not performed on a region of a pixel portion in a display device and laser light irradiation is performed on the other regions (e.g. a driver circuit, and the like). Thus, a semiconductor substrate having single-crystal semiconductor layers each of which has its required characteristic can be manufactured.

Note that, as a method for selective irradiation with laser light, a method in which only a necessary portion is irradiated with laser light of which irradiation region is narrow, as selected; a method in which a metal mask is provided over the single-crystal semiconductor layer 400 and then a region which is irradiated with laser light and a region which is not irradiated with laser light are determined and formed; a method in which a film serving as a mask (a mask film) for laser light is formed over the single-crystal semiconductor layer 400 and is then patterned to select a region which is irradiated with laser light and a region which is not irradiated with laser light; or the like, can be given. When laser light of which irradiation region is narrow is used, provision of the metal mask and formation of the mask film are not necessary; therefore, the process can be simplified. In a method in which a metal mask or a mask film is formed, an entire surface of the single-crystal semiconductor layer 400 can be irradiated with laser light, which leads to improvement in throughput. When a mask is used, accuracy of the irradiation position of laser light can be improved.

Next, the single-crystal semiconductor layer 400 is patterned to have a desired island shape. At this time, the region 402 which is irradiated with laser light and the other region are divided (see FIG. 4C). Thus, a semiconductor substrate having a single-crystal semiconductor layer 404 which is irradiated with laser light and a single-crystal semiconductor layer 406 which is not irradiated with laser light is completed. Note that, in FIGS. 4A to 4C, patterning is performed after laser light irradiation; however, the present invention is not limited thereto. Laser light irradiation may be performed after patterning. Alternatively, heat treatment may be performed after patterning and then laser light irradiation may be performed. The order of the steps of heat treatment, laser light irradiation, and patterning can be changed as appropriate.

This embodiment mode can be combined with Embodiment Mode 1 as appropriate.

Embodiment Mode 3

This embodiment mode will describe an example of a manufacturing method of a semiconductor device of the present invention with reference to FIGS. 5A to 5D, FIGS. 6A to 6C, FIGS. 7A to 7C, and FIGS. 8A and 8B. Note that a liquid crystal display device is given as an example of a semiconductor device in this embodiment mode; however, a semiconductor device of the present invention is not limited to a liquid crystal display device.

First, a single-crystal semiconductor layer is formed over a substrate having an insulating surface by the method shown in Embodiment Mode 1 or 2. Here, a structure in which a barrier layer 502, a bonding layer 504, and a single-crystal semiconductor layer 506 are sequentially provided over a substrate 500 having an insulating surface is described (see FIG. 5A); however, the present invention is not limited thereto. Note that a structure after laser light irradiation and patterning is illustrated in FIG. 5A. A single-crystal semiconductor layer which is irradiated with laser light is used for a peripheral driver circuit region 580 and a single-crystal semiconductor layer which is not irradiated with laser light is used for a pixel region 590.

As to an etching process in the patterning, either plasma etching (dry etching) or wet etching may be employed. In a case of processing a large-sized substrate, plasma etching is suitable. As to an etching gas, a fluorine-based or chlorine-based gas such as $CF_4$, $NF_3$, $Cl_2$, or $BCl_3$ is used, and an inert gas such as He or Ar may be added, as appropriate. In addition, when an etching process using an electric discharge at atmospheric pressure is applied, electric discharge can be locally performed, and it is not necessary to form a mask layer over an entire surface of the substrate.

Here, a p-type impurity such as boron, aluminum, or gallium may be added into the single-crystal semiconductor layer 506 in order to control a threshold voltage. For example, as a p-type impurity, boron can be added at a concentration of greater than or equal to $5 \times 10^{17}$ cm$^{-3}$ and less than or equal to $1 \times 10^{18}$ cm$^{-3}$.

As the barrier layer 502, a silicon nitride layer and a silicon oxide layer are formed in a stacked-layer structure over the substrate 500 having an insulating surface. The barrier layer 502 is provided, so that contamination of the single-crystal semiconductor layer 506 with movable ions can be prevented. Note that a silicon nitride oxide layer, an aluminum nitride layer, or an aluminum nitride oxide layer may be applied as an alternative to the silicon nitride layer.

Next, a gate insulating layer 508 which covers the single-crystal semiconductor layers 506 is formed (see FIG. 5B). Note that for convenience, the island-shaped single-crystal semiconductor layers which are formed by patterning are each referred to as single-crystal semiconductor layers 510, 512, and 514. The gate insulating layer 508 is formed of a silicon-containing insulating film by a plasma CVD method, a sputtering method, or the like, to have a thickness of 10 nm to 150 nm. Specifically, the gate insulating layer 508 may be formed from an oxide material or a nitride material of silicon typified by silicon nitride, silicon oxide, silicon oxynitride, and silicon nitride oxide, or the like. Note that the gate insulating layer 508 may have a single-layer structure or a stacked-layer structure. Further, a thin silicon oxide film having a thickness of 1 nm to 100 nm, preferably 1 nm to 10 nm, and more preferably 2 nm to 5 nm, may be formed between the single-crystal semiconductor layers and the gate insulating layer. As a method for forming a thin silicon oxide film, a method in which a thermal oxide film is formed by an RTA method, or the like can be given. Note that a rare gas element such as argon may be contained in a reactive gas in order to form a gate insulating film with little leak current at a low temperature.

Next, a first conductive film and a second conductive film which are used as a gate electrode layer are stacked over the gate insulating layer 508. The thickness of the first conductive film may be approximately 20 nm to 100 nm, and the thickness of the second conductive film may be approximately 100 nm to 400 nm. The first conductive film and the second conductive film can be formed by a sputtering method, an evaporation method, a CVD method, or the like. The first conductive film and the second conductive film may be formed of an element selected from tantalum (Ta), tungsten (W), titanium (Ti), molybdenum (Mo), aluminum (Al), copper (Cu), chromium (Cr), or neodymium (Nd), an alloy material or a compound material including any of those elements as a main component, or the like. A semiconductor film typified by a polycrystalline silicon film that is doped with an impurity element such as phosphorus, an AgPdCu alloy, or the like may also be used as the first conductive film and the second conductive film. Note that the two-layer structure is described in this embodiment mode; however, the present invention is not limited thereto. Alternatively, a stacked structure of three or more layers or a single-layer structure may be employed.

Then, a photolithography method is used to form masks 516a, 516b, 516c, 516d, and 516e each formed of a resist material. Then, the first conductive film and the second conductive film are processed into a desired shape with the use of the masks to form first gate electrode layers 518a, 518b, 518c, and 518d, a first conductive layer 518e, and conductive layers 520a, 520b, 520c, 520d, and 520e (see FIG. 5C).

By using an inductively coupled plasma (ICP) etching method and adjusting etching conditions (the amount of electric power applied to a coil-shaped electrode layer, the amount of electric power applied to an electrode layer on the side of a substrate, an electrode temperature on the side of a substrate, and the like) as appropriate, etching can be performed so as to obtain a desired taper shape. Alternatively, the taper angle and the like can be controlled by the shape of the mask. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used, as appropriate. In this embodiment mode, the second conductive film is etched using an etching gas containing $CF_4$, $Cl_2$, and $O_2$, and the first conductive film is successively etched using an etching gas containing $CF_4$ and $Cl_2$.

Next, the conductive layers 520a, 520b, 520c, 520d and 520e are processed into a desired shape, using the masks 516a, 516b, 516c, 516d, and 516e. At this time, etching is performed under an etching condition in which the selectivity of the second conductive film, which forms the conductive layers, to the first conductive film, which forms the first gate electrode layers and the first conductive layer, is high. By this etching, second gate electrode layers 522a, 522b, 522c, and 522d, and a second conductive layer 522e are formed. In this embodiment mode, the second gate electrode layers and the second conductive layer also have a taper shape, and the respective taper angles are larger than the taper angles of the first gate electrode layers 518a, 518b, 518c, and 518d and the first conductive layer 518e. Note that a taper angle is an angle between a bottom surface and a side surface of an object. Thus, when each taper angle is 90 degrees, the conductive layers each have a side surface perpendicular to the bottom surface. When each taper angle has a degree of less than 90 degrees, coverage of stacked films is improved; thus, defects can be reduced. Note that in this embodiment mode, $Cl_2$, $SF_6$, and $O_2$ are used as an etching gas for forming the second gate electrode layers and the second conductive layer.

Through the above steps, gate electrode layers 524a and 524b can be formed in a peripheral driver circuit region 580, and gate electrode layers 524c and 524d and a conductive layer 524e can be formed in a pixel region 590 (see FIG. 5D). Note that the masks 516a, 516b, 516c, 516d, and 516e are removed after the above-described step.

Next, an impurity element imparting n-type conductivity is added using the gate electrode layers 524a, 524b, 524c, and 524d as masks to form first n-type impurity regions 526a, 526b, 528a, 528b, 530a, 530b, and 530c (see FIG. 6A). In this embodiment mode, doping is performed using phosphine ($PH_3$) as a doping gas containing an impurity element. Here, phosphorus (P) which is an impurity element imparting n-type conductivity is added in the first n-type impurity regions at a concentration of approximately $1 \times 10^{17}$ to $5 \times 10^{18}$/cm$^3$.

Next, a mask 532a, a mask 532b, and a mask 532c are formed to cover the single-crystal semiconductor layer 510 and part of the single-crystal semiconductor layer 514. An impurity element imparting n-type conductivity is added using the masks 532a, 532b, and 532c, and the second gate electrode layer 522b as masks. Accordingly, second n-type impurity regions 534a and 534b; third n-type impurity regions 536a and 536b; second n-type impurity regions 540a, 540b, and 540c; and third n-type impurity regions 542a, 542b, 542c, and 542d are formed. In this embodiment mode, doping is performed using phosphine (PH$_3$) as a doping gas containing an impurity element. Here, phosphorus (P) which is an impurity element imparting n-type conductivity is added to the second n-type impurity regions at a concentration of approximately $5\times10^{19}$ to $5\times10^{20}$/cm$^3$. The third n-type impurity regions 536a and 536b are formed to contain the impurity element imparting n-type conductivity at the same concentration as or at a slightly higher concentration than the third n-type impurity regions 542a, 542b, 542c, and 542d. In addition, channel formation regions 538, 544a, and 544b are formed (see FIG. 6B).

Each of the second n-type impurity regions is a high-concentration impurity region and functions as a source or a drain. On the other hand, each of the third n-type impurity regions is a low-concentration impurity region and functions as a so-called LDD (Lightly Doped Drain) region. Each of the third n-type impurity regions 536a and 536b is formed in a region overlapped with the first gate electrode layer 518b. Accordingly, an electric field in the vicinity of a source or a drain can be relieved, and deterioration of on-state current due to hot carriers can be prevented. On the other hand, each of the third n-type impurity regions 542a, 542b, 542c, and 542d is not overlapped with the gate electrode layer 524c or 524d; thus, an effect of reducing off-state current can be obtained.

Next, the masks 532a, 532b, and 532c are removed, and masks 546a and 546b which respectively cover the single-crystal semiconductor layers 512 and 514 are formed. An impurity element imparting p-type conductivity is added using the masks 546a and 546b and the gate electrode layer 524a as masks. Accordingly, first p-type impurity regions 548a and 548b, and second p-type impurity regions 550a and 550b are formed. In this embodiment mode, doping is performed using diborane (B$_2$H$_6$) as a doping gas containing an impurity element. Here, boron (B) which is an impurity element imparting p-type conductivity is added to the first p-type impurity regions and the second p-type impurity regions at a concentration of approximately $1\times10^{20}$ to $5\times10^{21}$/cm$^3$. In addition, a channel formation region 552 is formed (see FIG. 6C).

Each of the first p-type impurity regions is a high-concentration impurity region and functions as a source or a drain. On the other hand, each of the second p-type impurity regions is a low-concentration impurity region and functions as a so-called LDD (Lightly Doped Drain) region.

After that, the masks 546a and 546b are removed. After the masks are removed, an insulating film may be formed so as to cover the side surfaces of the gate electrode layers. The insulating film can be formed by a plasma CVD method or a low-pressure CVD (LPCVD) method. Heat treatment, intense light irradiation, laser light irradiation, or the like may be performed in order to activate the impurity elements.

Next, an interlayer insulating layer which covers the gate electrode layers and the gate insulating layer is formed. In this embodiment mode, the interlayer insulating layer is formed to have a stacked-layer structure of insulating films 554 and 556 (see FIG. 7A). The stacked-layer structure is formed by forming a silicon nitride oxide film with a thickness of 100 nm as the insulating film 554 and forming a silicon oxynitride film with a thickness of 900 nm as the insulating film 556. Although the two-layer structure is employed in this embodiment mode, a single-layer structure or a stacked-layer structure of three or more layers may be employed. In this embodiment mode, the insulating film 554 and the insulating film 556 are continuously formed using a plasma CVD method. Note that the insulating films 554 and 556 are not limited to the above-described material.

The insulating films 554 and 556 can alternatively be formed from a material selected from silicon oxide, silicon nitride, aluminum oxide, aluminum nitride (AlN), aluminum oxynitride (AlON), aluminum nitride oxide containing more nitrogen than oxygen (AlNO), diamond-like carbon (DLC), a nitrogen-containing carbon film, or another substance containing an inorganic insulating material. Alternatively, a siloxane resin may be used. Note that a siloxane resin is a resin including a Si—O—Si bond. Siloxane is composed of a skeleton formed by the bond of silicon (Si) and oxygen (O), in which an organic group containing at least hydrogen (such as an alkyl group and an aryl group) is used as a substituent. Alternatively, a fluoro group may be included in the organic group. Alternatively, an organic insulating material such as polyimide, acrylic polymer, polyamide, polyimide amide, benzocyclobutene-based material, or polysilazane can be used.

Next, contact holes (openings) which reach the single-crystal semiconductor layers and the gate electrode layers are formed in the insulating films 554 and 556 and the gate insulating layer 508, using a mask formed of a resist material. Etching may be performed once or plural times depending on the selectivity of a material to be used. In this embodiment mode, first etching is performed under a condition in which high etching selectivity can be obtained between the insulating film 556 which is a silicon oxynitride film, and the insulating film 554 which is a silicon nitride oxide film and the gate insulating layer 508. Accordingly, the insulating film 556 is removed. Next, the insulating film 554 and the gate insulating layer 508 are removed by second etching, and openings which each reach a source or a drain are formed.

Then, a conductive film is formed so as to cover the openings, and the conductive film is etched. Accordingly, source or drain electrode layers 558a, 558b, 560a, 560b, 562a, and 562b which are electrically connected to part of each source or drain region are formed. The source or drain electrode layers can be formed using one or a plurality of elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), nickel (Ni), zinc (Zn), niobium (Nb), silicon (Si), phosphorus (P), boron (B), arsenic (As), gallium (Ga), indium (In), or tin (Sn); a compound or an alloy material containing any of the above elements as its component (for example, indium tin oxide (ITO), indium zinc oxide (IZO), indium tin oxide added with silicon oxide (ITSO), zinc oxide (ZnO), aluminum-neodymium (Al—Nd), magnesium-silver (MgAg), or the like); a material that is a combination of any of these compounds; or the like. Alternatively, a silicide (for example, aluminum-silicon, molybdenum-silicon, or nickel silicide), a nitrogen-containing compound (for example, titanium nitride, tantalum nitride, or molybdenum nitride), silicon (Si) that is doped with an impurity element such as phosphorus (P), or the like can be used.

Through the above steps, a p-channel thin film transistor 564 and an n-channel thin film transistor 566 are formed in the peripheral driver circuit region 580, and an n-channel thin film transistor 568 and a capacitor wiring 570 are formed in the pixel region 590 (see FIG. 7B).

Then, an insulating film 572 is formed as a second interlayer insulating layer. The insulating film 572 can be formed of a material selected from silicon oxide, silicon nitride, silicon oxynitride, silicon nitride oxide, aluminum oxide, aluminum nitride (AlN), aluminum oxynitride (AlON), aluminum nitride oxide containing more nitrogen than oxygen (AlNO), diamond-like carbon (DLC), a nitrogen-containing carbon film, phosphosilicate glass (PSG), borophosphosilicate glass (BPSG), an alumina film, polysilazane, or another substance containing an inorganic insulating material. Alternatively, a siloxane resin may be used. Further alternatively, an organic insulating material such as polyimide, acrylic polymer, polyamide, polyimide amide, or benzocyclobutene-based material can be used.

In this embodiment mode, the interlayer insulating layer provided for planarization is required to have a high heat resistant property, a high insulating property, and a high planarizing ability. Therefore, the second interlayer insulating layer is preferably formed by a coating method typified by a spin coating method.

Next, a contact hole is formed in the insulating film 572 of the pixel region 590 to form a pixel electrode layer 574 (see FIG. 7C). The pixel electrode layer 574 can be formed using indium tin oxide (ITO), indium zinc oxide (IZO) in which zinc oxide (ZnO) is mixed with indium oxide, a conductive material in which silicon oxide ($SiO_2$) is mixed with indium oxide, organic indium, organic tin, indium oxide containing tungsten oxide, indium zinc oxide containing tungsten oxide, indium oxide containing titanium oxide, indium tin oxide containing titanium oxide, a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), an alloy thereof, or metal nitride thereof.

A conductive composition containing a conductive macromolecule (also referred to as a conductive polymer) can also be used as the pixel electrode layer 574. A thin film of a conductive composition preferably has a sheet resistance of less than or equal to 10000 Ω/square. When a thin film of a conductive composition is formed as a pixel electrode layer having a light-transmitting property, light transmittance is preferably greater than or equal to 70% at a wavelength of 550 nm. Further, the resistivity of a conductive macromolecule which is contained in the thin film of a conductive composition is preferably less than or equal to 0.1 Ω·cm.

As the above-described conductive macromolecule, a so-called π electron conjugated conductive macromolecule can be used. For example, polyaniline and a derivative thereof, polypyrrole and a derivative thereof, polythiophene and a derivative thereof, and a copolymer of those materials can be given.

Specific examples of a conjugated conductive macromolecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

Any of the above-described conductive macromolecules may be used alone. Alternatively, any of the above-described conductive macromolecules can be used with an organic resin added thereto to adjust film characteristics.

As to an organic resin, as long as a resin is compatible to a conductive macromolecule or a resin can be mixed and dispersed into a conductive macromolecule, a thermosetting resin, a thermoplastic resin, or a photocurable resin may be used. For example, a polyester-based resin such as poly(ethylene terephthalate), poly(butylene terephthalate), or poly (ethylene naphthalate); a polyimide-based resin such as polyimide or polyimide amide; a polyamide resin such as polyamide 6, polyamide 6,6, polyamide 12, or polyamide 11; a fluorine resin such as poly(vinylidene fluoride), poly(vinyl fluoride), polytetrafluoroethylene, ethylene-tetrafluoroethylene copolymer, or polychlorotrifluoroethylene; a vinyl resin such as poly(vinyl alcohol), poly(vinyl ether), poly(vinyl butyral), poly(vinyl acetate), or polyvinylchloride; an epoxy resin; a xylene resin; an aramid resin; a polyurethane-based resin; a polyurea-based resin, a melamine resin; a phenol-based resin; polyether; an acrylic-based resin, and a copolymer of any of those resins can be given.

Further, a conductive composition may be doped with an acceptor dopant or a donor dopant, so that oxidation-reduction potential of a conjugated conductive macromolecule is changed and conductivity of the conductive composition is adjusted.

A halogen compound, a Lewis acid, a protonic acid, an organic cyano compound, an organometallic compound, or the like can be used as an acceptor dopant. Examples of a halogen compound are chlorine, bromine, iodine, iodine chloride, iodine bromide, and iodine fluoride. Examples of a Lewis acid are phosphorus pentafluoride, arsenic pentafluoride, antimony pentafluoride, boron trifluoride, boron trichloride, and boron tribromide. Examples of a protonic acid include an inorganic acid such as hydrochloric acid, sulfuric acid, nitric acid, phosphoric acid, fluoroboric acid, hydrofluoric acid, and perchloric acid; and an organic acid such as organic carboxylic acid and organic sulfonic acid. As an organic cyano compound, a compound having two or more cyano groups in a conjugated bonding, for example, tetracyanoethylene, tetracyanoethylene oxide, tetracyanobenzene, tetracyanoquinodimethane, and tetracyanoazanaphthalene can be given.

As a donor dopant, alkali metal, alkaline earth metal, a tertiary amine compound, and the like can be given.

As described above, a conductive composition is dissolved in water or an organic solvent (e.g., an alcohol-based solvent, a ketone-based solvent, an ester-based solvent, a hydrocarbon-based solvent, or an aromatic solvent), so that a thin film which serves as the pixel electrode layer 574 can be formed by an application method, a coating method, a droplet discharge method (also referred to as an ink-jet method), or a wet method such as a printing method.

Figure 8A:
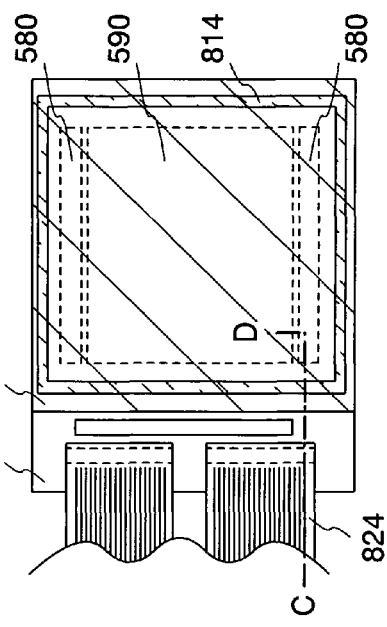
FIGS. 8A and 8B are a plane view and a cross-sectional view, respectively, illustrating a semiconductor device in connection with an Embodiment Mode of the present invention.
Figure 8B:
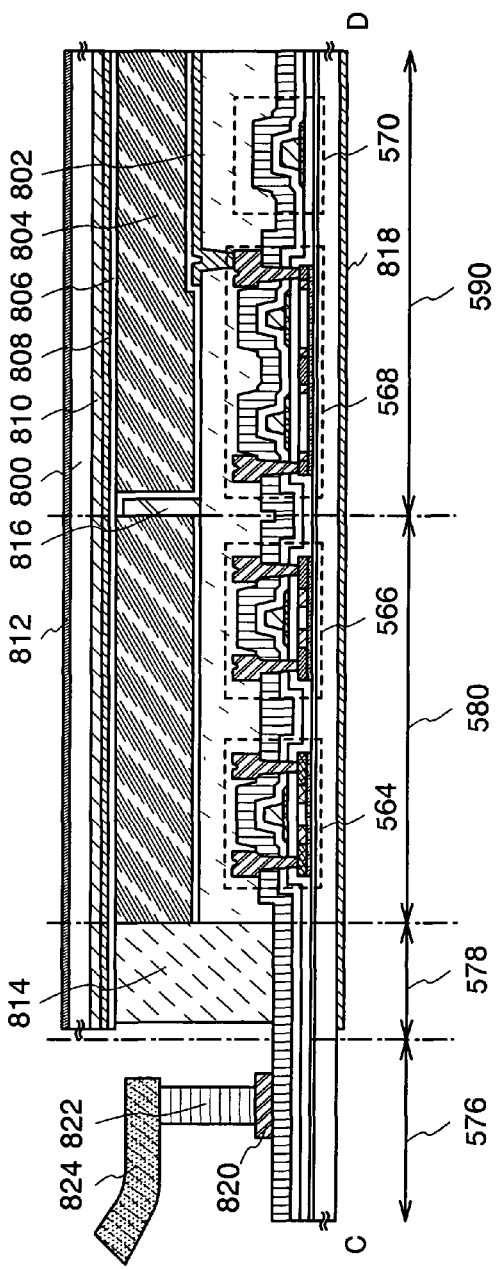

Next, an insulating layer 802 which is referred to as an alignment film is formed so as to cover the pixel electrode layer 574 and the insulating film 572 (see FIG. 8B). The insulating layer 802 can be formed by a screen printing method or an offset printing method. Note that FIGS. 8A and 8B illustrate a plan view and a cross-sectional view of a semiconductor device, respectively, and FIG. 8A is a plan view of a semiconductor device and FIG. 8B is a cross-sectional view taken along line C-D of FIG. 8A. In the semiconductor device, an external terminal connection region 576, a sealing region 578, the peripheral driver circuit region 580, and the pixel region 590 are provided.

After the insulating layer 802 is formed, rubbing treatment is performed. An insulating layer 806 which serves as an alignment film can also be formed in a manner similar to that of the insulating layer 802.

After that, an opposite substrate 800 and the substrate 500 having an insulating surface are attached to each other, with a sealant 814 and a spacer 816 interposed therebetween, and the space is provided with a liquid crystal layer 804. Note that the opposite substrate 800 is provided with the insulating layer 806 which serves as an alignment film, a conductive layer 808 which serves as an opposite electrode, a colored layer 810 which serves as a color filter, a polarizer 812 (also referred to as a polarizing plate), and the like. Note that a polarizer 818 (a polarizing plate) is also provided to the substrate 500 having an insulating surface; however, the present invention is not limited to this structure. For example, a polarizer may be provided on one side in a reflective type liquid crystal display device.

Subsequently, an FPC 824 is connected to a terminal electrode layer 820 which is electrically connected to the pixel region, through an anisotropic conductive layer 822. The FPC 824 has a function of transmitting a signal from the external. Through the above-described steps, a liquid crystal display device can be manufactured.

In the present invention, a semiconductor device is manufactured using a single-crystal semiconductor layer which is irradiated with laser light and a single-crystal semiconductor layer which is not irradiated with laser light. Thus, a semiconductor device using a single-crystal semiconductor layer which is suitable for a peripheral driver circuit region and a single-crystal semiconductor layer which is suitable for a pixel region can be provided.

That is, a semiconductor device with less variation in luminance among pixels can be obtained as compared to a case where a pixel region is formed using a single-crystal semiconductor layer which is irradiated with laser light. Further, in the peripheral driver circuit region, a single-crystal semiconductor layer having high mobility and excellent switching characteristics is used; therefore, a semiconductor device in which an area of a frame portion is reduced and a display region is utilized effectively can be provided. Furthermore, since an IC chip need not be provided by being attached externally, a semiconductor device with reduced thickness can be provided at reduced cost.

Note that in this embodiment mode, a method for manufacturing a liquid crystal display device is described; however, the present invention is not limited thereto. This embodiment mode can be combined with any of Embodiment Modes 1 and 2 as appropriate.

Embodiment Mode 4

In this embodiment mode, a semiconductor device having a light-emitting element (an electroluminescent display device) will be described. Note that as to a manufacturing method of transistors which are used for a peripheral driver circuit region, a pixel region, and the like, it is possible to refer to Embodiment Mode 3; thus, the details are omitted.

Note that when a transistor is manufactured using a single-crystal semiconductor layer which is irradiated with laser light, a drain current ($I_d$)-gate voltage ($V_g$) curve rises steeply. On the other hand, when a transistor is manufactured using a single-crystal semiconductor layer which is not irradiated with laser light, the drain current ($I_d$)-gate voltage ($V_g$) curve rises gradually. In this embodiment mode, an electroluminescent display device using optimal single-crystal semiconductor layers is provided by using a difference in these characteristics.

As to a semiconductor device having a light-emitting element, any one of bottom emission, top emission, and dual emission can be employed. This embodiment mode will describe a semiconductor device employing bottom emission with reference to FIGS. 9A and 9B; however, the present invention is not limited thereto.

Figure 9A:
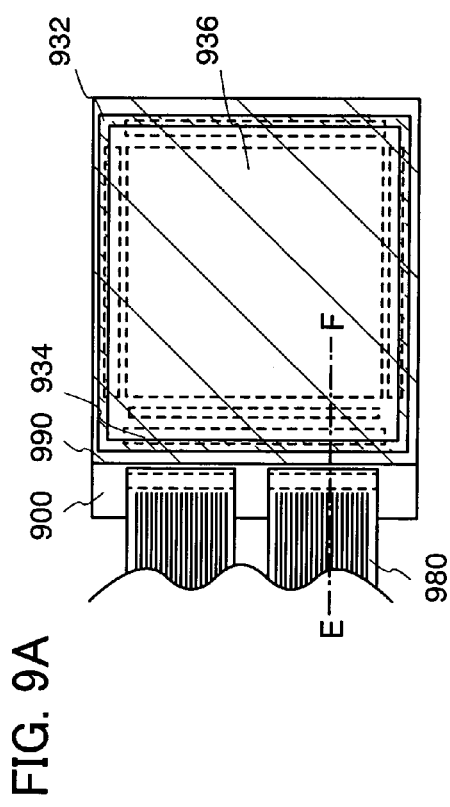
FIG. 9A and FIG. 9B are a plane view and a cross-sectional view, respectively, illustrating a semiconductor device in connection with an Embodiment Mode of the present invention.
Figure 9B:
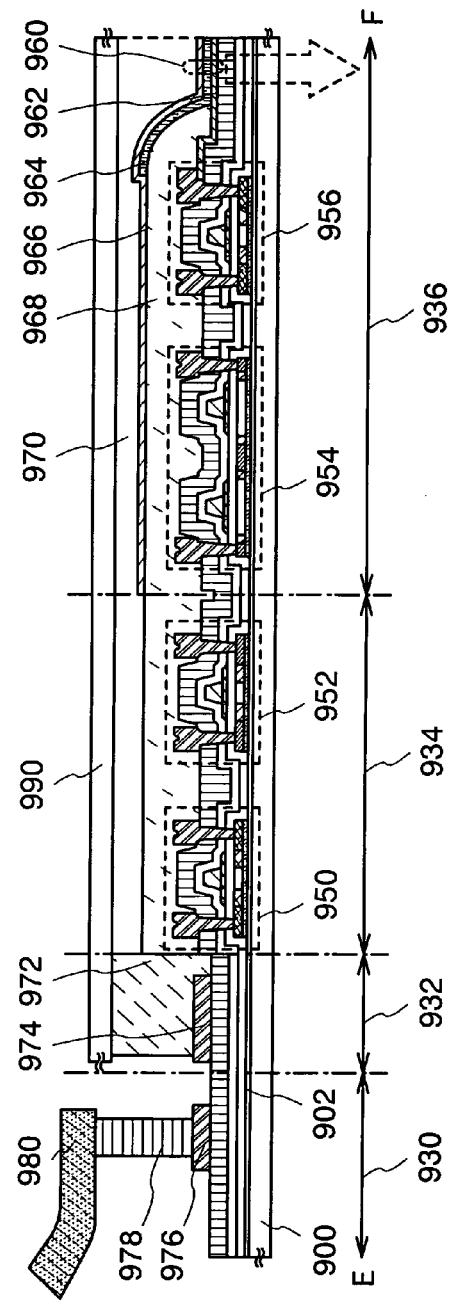

In a semiconductor device illustrated in FIGS. 9A and 9B, light is emitted downwardly (in a direction indicated by an arrow). Here, FIG. 9A is a plan view of the semiconductor device, and FIG. 9B is a cross-sectional view taken along line E-F of FIG. 9A. In FIGS. 9A and 9B, the semiconductor device includes an external terminal connection region 930, a sealing region 932, a driver circuit region 934, and a pixel region 936.

The semiconductor device illustrated in FIGS. 9A and 9B includes an element substrate 900, an insulating film 902, thin film transistors 950, 952, 954, and 956, a light-emitting element 960, an insulating layer 968, a filler 970, a sealant 972, a wiring layer 974, a terminal electrode layer 976, an anisotropic conductive layer 978, an FPC 980, and a sealing substrate 990. Note that the light-emitting element 960 includes a first electrode layer 962, a light-emitting layer 964, and a second electrode layer 966.

As the first electrode layer 962, a light-transmitting conductive material is used so that light emitted from the light-emitting layer 964 can be transmitted. On the other hand, as the second electrode layer 966, a conductive material which can reflect light emitted from the light-emitting layer 964 is used.

As the first electrode layer 962, indium oxide containing tungsten oxide, indium zinc oxide containing tungsten oxide, indium oxide containing titanium oxide, indium tin oxide containing titanium oxide, or the like can be used. Note that indium tin oxide (ITO), indium zinc oxide (IZO), indium tin oxide added with silicon oxide (ITSO), or the like may also be used.

A conductive composition containing a conductive macromolecule (also referred to as a conductive polymer) can also be used as the first electrode layer 962. Note that as to the details, it is possible to refer to Embodiment Mode 3; thus, the descriptions are omitted.

As the second electrode layer 966, a conductive film formed of titanium, tungsten, nickel, gold, platinum, silver, copper, tantalum, molybdenum, aluminum, magnesium, calcium, lithium, or an alloy thereof may be used. Preferably, a substance having high reflectivity in a visible region is used, and an aluminum film is used in this embodiment mode.

Note that in the case of employing each of top emission and dual emission, the design of the electrode layers may be changed, as appropriate. Specifically, in the case of top emission, the first electrode layer 962 is formed using a reflective material, and the second electrode layer 966 is formed using a light-transmitting material. In the case of dual emission, the first electrode layer 962 and the second electrode layer 966 may be formed using a light-transmitting material. Note that in the case of bottom emission and top emission, a structure may be employed in which one electrode layer is formed using a light-transmitting material and the other electrode layer is formed in a stacked-layer structure of a light-transmitting material and a light-reflecting material. The material that can be used for the electrode layers is similar to the material in the case of bottom emission; thus, the descriptions are omitted.

Note that even in the case of such a material as a metal film without a light-transmitting property, light can be transmitted by reduction in film thickness (approximately 5 nm to 30 nm). Accordingly, an electrode layer which transmits light can also be formed using the above-described light-reflecting material.

The sealing substrate 990 may be provided with a color filter (a colored layer). The color filter (a colored layer) can be formed by an evaporation method or a droplet discharge method. Alternatively, a color conversion layer may be used.

According to the present invention, an electroluminescent display device using a single-crystal semiconductor layer which is irradiated with laser light and a single-crystal semiconductor layer which is not irradiated with laser light can be provided. In the electroluminescent display device, characteristics of a rising part of a drain current ($I_d$)-gate voltage ($V_g$) curve are sometimes used in order to control the amount of current passing through a light-emitting element. In this case, as to a transistor in a pixel region, the drain current ($I_d$)-gate voltage ($V_g$) curve preferably rises gradually (that is, a subthreshold swing (S value) which is $V_g$ necessary to increase $I_d$ by one digit is preferably large in the Id-Vg curve). When the drain current ($I_d$)-gate voltage ($V_g$) curve has rises steeply (that is, when the S value is small), a slight change in a gate voltage leads to a large change in drain current. That is, when the drain current ($I_d$)-gate voltage ($V_g$) curve rises steeply, it is difficult to display an accurate gray scale.

In this point, a single-crystal semiconductor layer of the present invention which is not irradiated with laser light is very suitable for a transistor in a pixel region. On the other hand, since a transistor of which drain current ($I_d$)-gate voltage ($V_g$) curve rises steeply can be obtained from a single-crystal semiconductor layer which is irradiated with laser light, the single-crystal semiconductor layer which is irradiated with laser light is suitable for a driver circuit, or the like. In this manner, single-crystal semiconductor layers each of which has its required characteristics can be used; therefore, a semiconductor device in which a gray scale can be expressed excellently can be provided by a simple method.

Further, when a single-crystal semiconductor layer which is not irradiated with laser light is used for a pixel region, a semiconductor device with reduced variation in transistor characteristics in a pixel region can be provided. Thus, a semiconductor device with less variation in luminance among pixels can be obtained as compared to a case where a pixel region is formed using a single-crystal semiconductor layer which is irradiated with laser light. Further, in the peripheral driver circuit region, a single-crystal semiconductor layer having high mobility and excellent switching characteristics is used; therefore, a semiconductor device in which an area of a frame portion is reduced and a display region is utilized effectively can be provided. Furthermore, since an IC chip need not be provided by being attached externally, a semiconductor device with reduced thickness can be provided at reduced cost.

Note that this embodiment mode is described using an electroluminescent display device; however, the present invention is not limited thereto. This embodiment mode can be implemented by being combined with any of Embodiment Modes 1 to 3, as appropriate.

Embodiment Mode 5

This embodiment mode will describe electronic devices each using a semiconductor device of the present invention with reference to FIGS. 10A to 10H.

Examples of electronic devices which are manufactured using a semiconductor device of the present invention include cameras such as a video camera and a digital camera, a goggle-type display (a head-mounted display), a navigation system, an audio reproducing device (such as car audio components), a computer, a game machine, a portable information terminal (such as a mobile computer, a cellular phone, a portable game machine, and an electronic book), an image reproducing device provided with a recording medium (specifically, a device for reproducing a recording medium such as a digital versatile disc (DVD) and having a display for displaying the reproduced image), and the like.

Figure 10A:
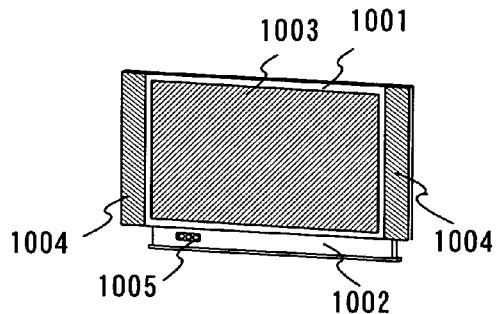
FIGS. 10A to 10H are views each illustrating an electronic device using a semiconductor device in connection with an Embodiment Mode of the present invention.

FIG. 10A illustrates a monitor of a television device or a personal computer, which includes a housing 1001, a support base 1002, a display portion 1003, speaker portions 1004, a video input terminal 1005, and the like. A semiconductor device of the present invention is used for the display portion 1003. According to the present invention, television device or a monitor of a personal computer with higher image quality can be provided at low cost.

Figure 10B:
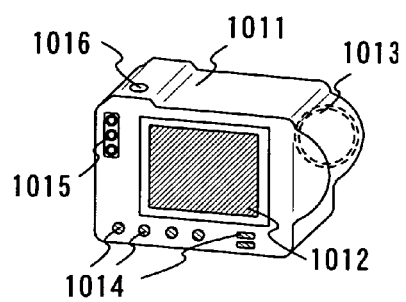

FIG. 10B illustrates a digital camera. An image receiving portion 1013 is provided in the front side of a main body 1011. A shutter button 1016 is provided at the upper portion of the main body 1011. A display portion 1012, operation keys 1014, and an external connection port 1015 are provided at the backside of the main body 1011. A semiconductor device of the present invention is used for the display portion 1012. According to the present invention, a low-cost digital camera with higher image quality can be provided.

Figure 10C:
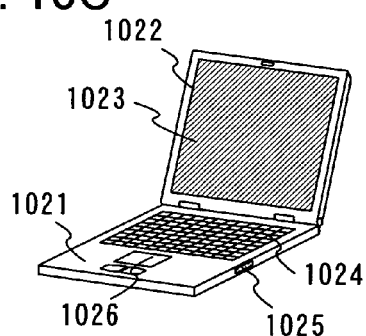

FIG. 10C illustrates a laptop personal computer. A main body 1021 is provided with a keyboard 1024, an external connection port 1025, and a pointing device 1026. A housing 1022 including a display portion 1023 is attached to the main body 1021. A semiconductor device of the present invention is used for the display portion 1023. According to the present invention, a low-cost laptop personal computer with higher image quality can be provided.

Figure 10D:
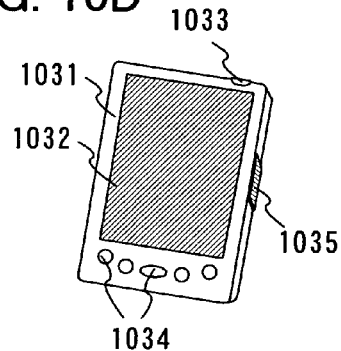

FIG. 10D illustrates a mobile computer, which includes a main body 1031, a display portion 1032, a switch 1033, operation keys 1034, an infrared port 1035, and the like. An active matrix display device is provided for the display portion 1032. A semiconductor device of the present invention is used for the display portion 1032. According to the present invention, a low-cost mobile computer with higher image quality can be provided.

Figure 10E:
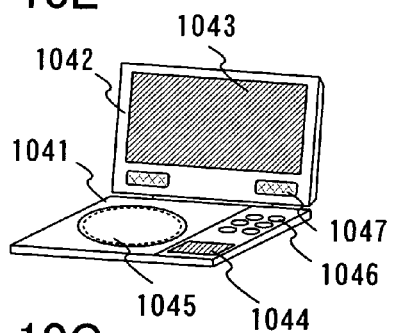

FIG. 10E illustrates an image reproducing device. A main body 1041 is provided with a display portion B 1044, a recording medium reading portion 1045, and operation keys 1046. A housing 1042 including a speaker portion 1047 and a display portion A 1043 is attached to the main body 1041. A semiconductor device of the present invention is used for each of the display portion A 1043 and the display portion B 1044. According to the present invention, a low-cost image reproducing device with higher image quality can be provided.

Figure 10F:
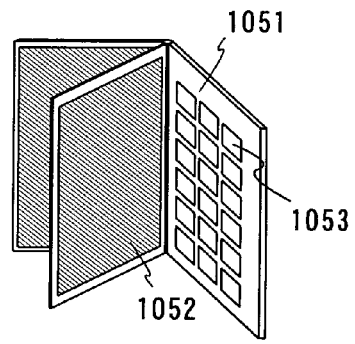

FIG. 10F illustrates an electronic book. A main body 1051 is provided with operation keys 1053. A plurality of display portions 1052 are attached to the main body 1051. A semiconductor device of the present invention is used for the display portions 1052. According to the present invention, a low-cost electronic book with higher image quality can be provided.

Figure 10G:
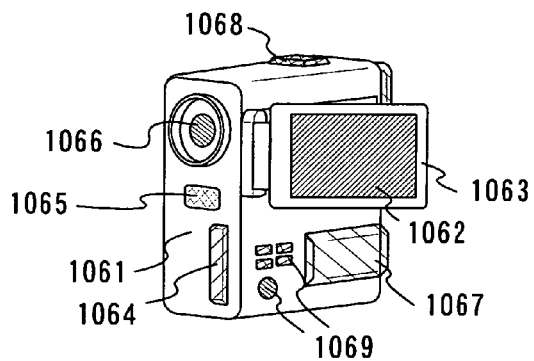

FIG. 10G illustrates a video camera. A main body 1061 is provided with an external connection port 1064, a remote control receiving portion 1065, an image receiving portion 1066, a battery 1067, an audio input portion 1068, and operation keys 1069. A housing 1063 including a display portion 1062 is attached to the main body 1061. A semiconductor device of the present invention is used for the display portion 1062. According to the present invention, a low-cost video camera with higher image quality can be provided.

Figure 10H:
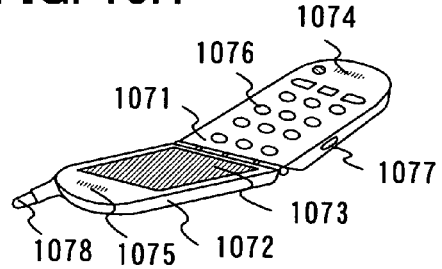

FIG. 10H illustrates a cellular phone, which includes a main body 1071, a housing 1072, a display portion 1073, an audio input portion 1074, an audio output portion 1075, operation keys 1076, an external connection port 1077, an antenna 1078, and the like. A semiconductor device of the present invention is used for the display portion 1073. According to the present invention, a low-cost cellular phone with higher image quality can be provided.

As described above, the application range of the present invention is extremely wide and the present invention can be used for electronic devices of every field. Note that this embodiment mode can be implemented by being combined with any of Embodiment Modes 1 to 4, as appropriate.

Embodiment 1

In this embodiment, difference in characteristics of a single-crystal semiconductor layer which is irradiated with laser light and a single-crystal semiconductor layer which is not irradiated with laser light will be described using experimental data illustrated in FIGS. 11A and 11B and FIG. 12. Note that in this embodiment, an experiment using excimer laser light as laser light was conducted; however, the present invention is not limited thereto.

In this embodiment, a single-crystal silicon layer which was irradiated with excimer laser light; and a single-crystal silicon layer which was not irradiated with excimer laser light were formed over a glass substrate, and then thin film transistors each were manufactured using the single-crystal silicon layers. That is, a thin film transistor including a single-crystal silicon layer irradiated with laser light and a thin film transistor including a single-crystal silicon layer not irradiated with laser light were manufactured, and comparison of characteristics was conducted. Specific conditions will be described below.

Heat treatment in separating a single-crystal silicon layer from a single-crystal silicon substrate was performed at 600° C. for 2 hours. After forming the single-crystal silicon layer, heat treatment was performed in a nitrogen atmosphere at 600° C. for 24 hours. After the heat treatment, part of the single-crystal silicon layer was irradiated with excimer laser light, whereby the single-crystal silicon layer which was irradiated with excimer laser light; and the single-crystal silicon layer which was not irradiated with excimer laser light were formed. Note that excimer laser light irradiation was performed in a nitrogen atmosphere. After a step of laser light irradiation, heat treatment was performed in a nitrogen atmosphere at 550° C. for 4 hours. Thin film transistors manufactured using the single-crystal silicon layers were all n-channel type. The thicknesses of gate insulating films of the n-channel transistors were 110 nm, the channel lengths thereof were 10 µm, and the channel widths thereof were 8 µm.

Figure 11A:
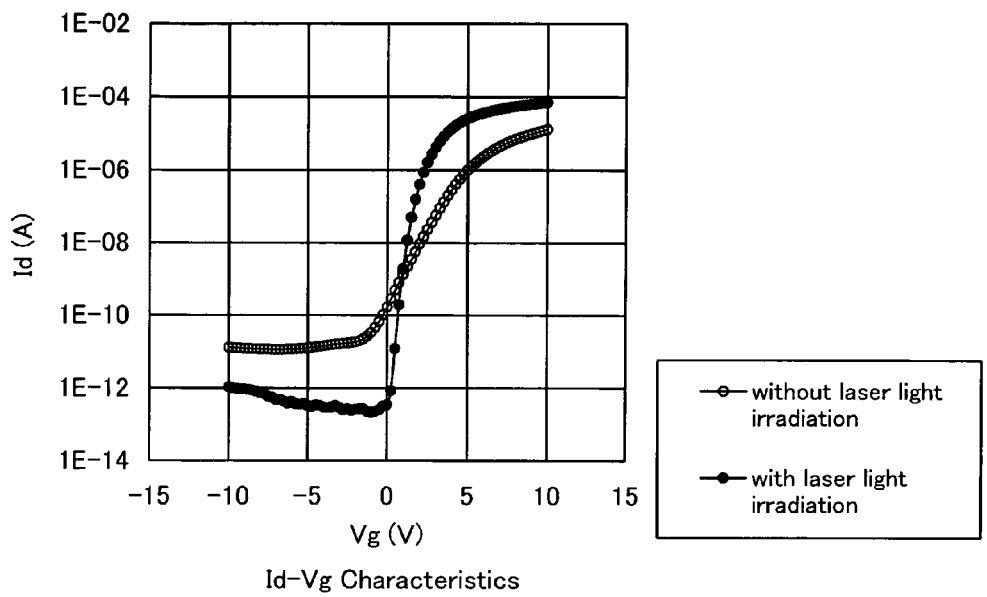
FIGS. 11A and 11B are graphs each illustrating characteristics of semiconductor devices in connection with an Embodiment Mode of the present invention.

FIG. 11A illustrates drain current ($I_d$)-gate voltage ($V_g$) curves of an n-channel transistor manufactured using a region which was irradiated with excimer laser light (hereinafter, referred to as "a transistor to which laser light irradiation was performed"), and an n-channel transistor manufactured using a region which was not irradiated with excimer laser light (hereinafter, referred to as "a transistor to which laser light irradiation was not performed"). These n-channel transistors were manufactured under the above-described conditions, and the thicknesses of the gate insulating films were 110 nm, the channel lengths were 10 µm, and the channel widths were 8 µm. Data illustrated in FIG. 11A was obtained by measurement when drain voltage ($V_d$) was 1V. As can be seen from FIG. 11A, as to the transistor to which laser light irradiation was performed (black circles in FIG. 11A), the drain current ($I_d$)-gate voltage ($V_g$) curve rises steeply, while as to the transistor to which laser light irradiation was not performed (white circles in FIG. 11A), the drain current ($I_d$)-gate voltage ($V_g$) curve rises gradually. Note that the subthreshold swing (S value) of the transistor to which laser light irradiation was performed was 0.21 V/dec, and the subthreshold swing (S value) of the transistor to which laser light irradiation was not performed was 1.10 V/dec.

Figure 11B:
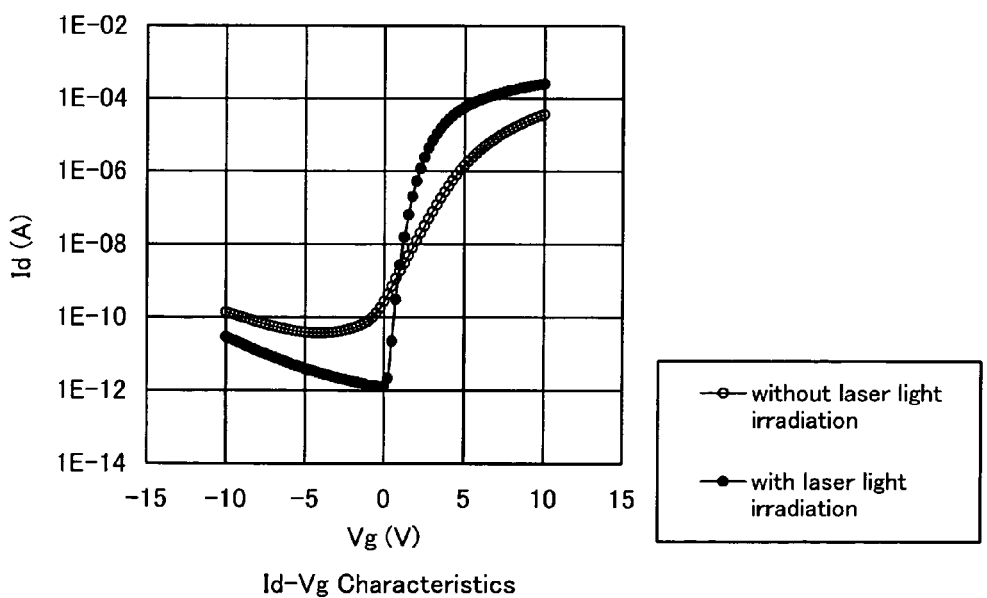

Data illustrated in FIG. 11B was obtained by measurement similarly to the case in FIG. 11A when drain voltage ($V_d$) was 5V. In the case where drain voltage ($V_d$) was 5V as well, as to the transistor to which laser light irradiation was performed (black circles in FIG. 11B), the drain current ($I_d$)-gate voltage ($V_g$) curve rises steeply. Further, as to the transistor to which laser light irradiation was not performed (white circles in FIG. 11B), the drain current ($I_d$)-gate voltage ($V_g$) curve rises gradually. Note that drain current ($I_d$) when drain voltage ($V_d$) was 5V was larger than that when drain voltage (Vd) was 1V; however, subthreshold swings (S values) or threshold voltages in rising are approximately the same.

From FIGS. 11A and 11B, it is found that as to the transistor to which laser light irradiation was performed, the $I_d$-$V_g$ curve rises steeply and a single-crystal silicon layer suitable for high-speed switching operation is obtained. On the other hand, it is found that as to the transistor to which laser light irradiation was not performed, the $I_d$-$V_g$ curve rises gradually and a single-crystal silicon layer which is suitable for controlling current in an analog manner is obtained.

Figure 12:
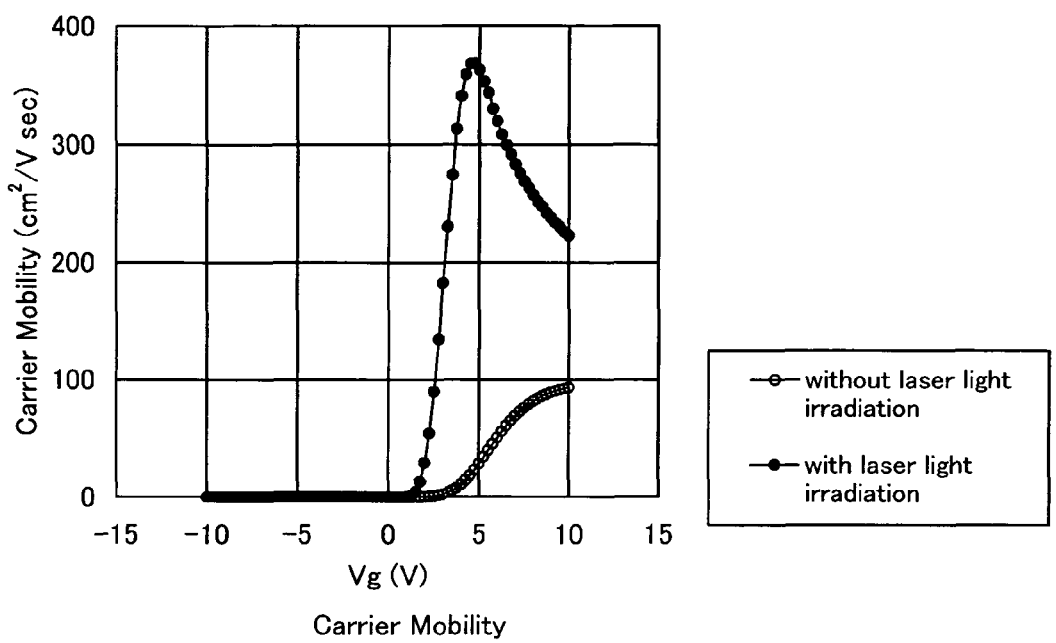
FIG. 12 is a graph illustrating characteristics of semiconductor devices in connection with an Embodiment Mode of the present invention.

FIG. 12 illustrates a plot of carrier mobility in each of the transistor to which laser light irradiation was performed and the transistor to which laser light irradiation was not performed. Carrier mobility of the transistor to which laser light irradiation was performed is indicated by black circles and carrier mobility of the transistor to which laser light irradiation was not performed is indicated by white circles (the unit is $cm^2$/Vsec). Note that drain voltage ($V_d$) was set to be 1V and measurement was performed to obtain data in FIG. 12. As can be seen from FIG. 12, the maximum value of carrier mobility of the transistor to which laser light irradiation was performed is approximately 370 $cm^2$/Vsec, which is large. On the other hand, the maximum value of carrier mobility of the transistor to which laser light irradiation was not performed is approximately 90 $cm^2$/Vsec, which is small. Note that in this embodiment, planarization treatment (CMP, or the like) after forming single-crystal silicon layers is omitted. When planarization treatment is performed after forming single-crystal silicon layers, characteristics are further improved.

In the present invention, a semiconductor device in which a gray scale can be expressed accurately is realized by using a single-crystal semiconductor layer which is not irradiated with laser light for a transistor in a pixel region. Note that in terms of carrier mobility, a single-crystal silicon layer which is not irradiated with laser light has characteristics similar to a microcrystalline silicon layer or a polycrystalline silicon layer; however, in terms of deterioration of a semiconductor layer, a single-crystal silicon layer which is not irradiated with laser light is superior to a microcrystalline silicon layer or a polycrystalline silicon layer, so that a highly reliable semiconductor device can be manufactured.

From a measurement result in this embodiment, it can be said that when a thickness of a gate insulating film is approximately 100 nm (approximately 70 nm to 130 nm), a subthreshold swing (S value) of a transistor at which an effect of laser light irradiation can be considered to be obtained is approximately 0.15 to 0.3 V/dec. On the other hand, it can be said that a subthreshold swing (S value) of a transistor using a single-crystal semiconductor layer which is not irradiated with laser light is approximately 0.6 to 1.6 V/dec. Accordingly, it can be said that a subthreshold swing (S value) of a transistor using a single-crystal semiconductor layer which is irradiated with laser light is less than or equal to half of that of a transistor using a single-crystal semiconductor layer which is not irradiated with laser light.

This embodiment can be combined with any of Embodiment Modes 1 to 5, as appropriate.

Embodiment 2

In this embodiment, a change of Raman spectrum of a single-crystal silicon layer depending on whether heat treatment is performed or not and whether laser light irradiation is performed or not will be described with reference to FIG. 13 and FIG. 14. Note that in this embodiment, excimer laser light is used as laser light with which a single-crystal silicon layer is irradiated; however, the present invention is not limited thereto.

Figure 13:
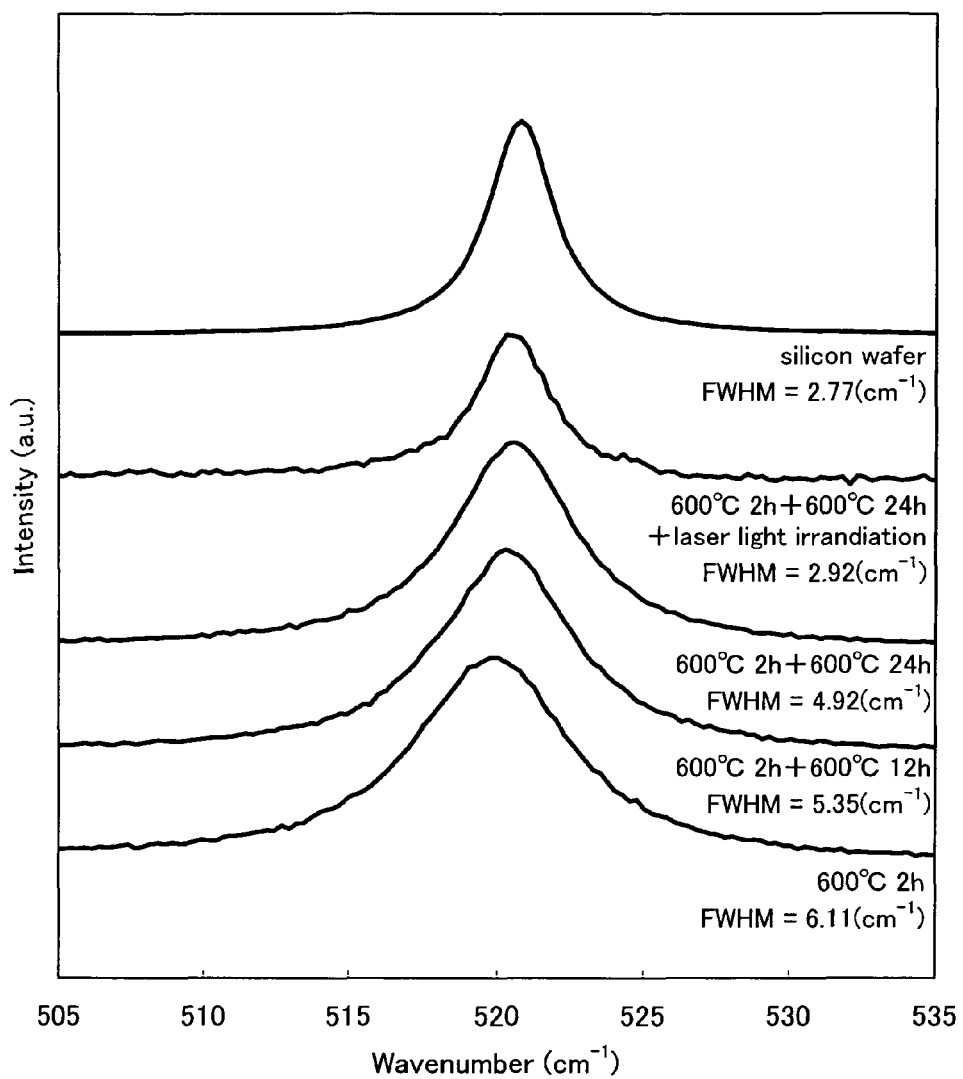
FIG. 13 is a graph in which characteristics of semiconductor films in Embodiment are compared.

FIG. 13 illustrates comparison of Raman spectra of single-crystal silicon layers under four treatment conditions and Raman spectrum of a single-crystal silicon substrate (hereinafter, simply referred to as "a wafer"). The horizontal axis represents a wavenumber and the vertical axis represents intensity (arbitrary unit). The four treatment conditions are "only heat treatment in separation (at 600° C. for 2 hours)", "heat treatment in separation (at 600° C. for 2 hours) and heat treatment at 600° C. for 12 hours", "heat treatment in separation (at 600° C. for 2 hours) and heat treatment at 600° C. for 24 hours", and "heat treatment in separation (at 600° C. for 2 hours), heat treatment at 600° C. for 24 hours, and excimer laser light irradiation".

As can be seen from FIG. 13, the peak wavenumbers of the single-crystal silicon layers on which heat treatment is performed at 600° C. for greater than or equal to 12 hours are shifted to a higher wavenumber side as compared to a single-crystal silicon layer on which only heat treatment in separation is performed, so that they are closer to that of the wafer. Raman spectrum indicates wavenumber difference of scattered light (Raman scattered light) with respect to incident light, and the wavenumber difference corresponds to vibrational energy between atoms. Accordingly, when the wavenumber of the Raman peak is close to that of the wafer, the crystal structure is close to that of the wafer. That is, it can be said that characteristics of a single-crystal silicon layer on which heat treatment is performed are closer to those of a wafer.

Figure 14:
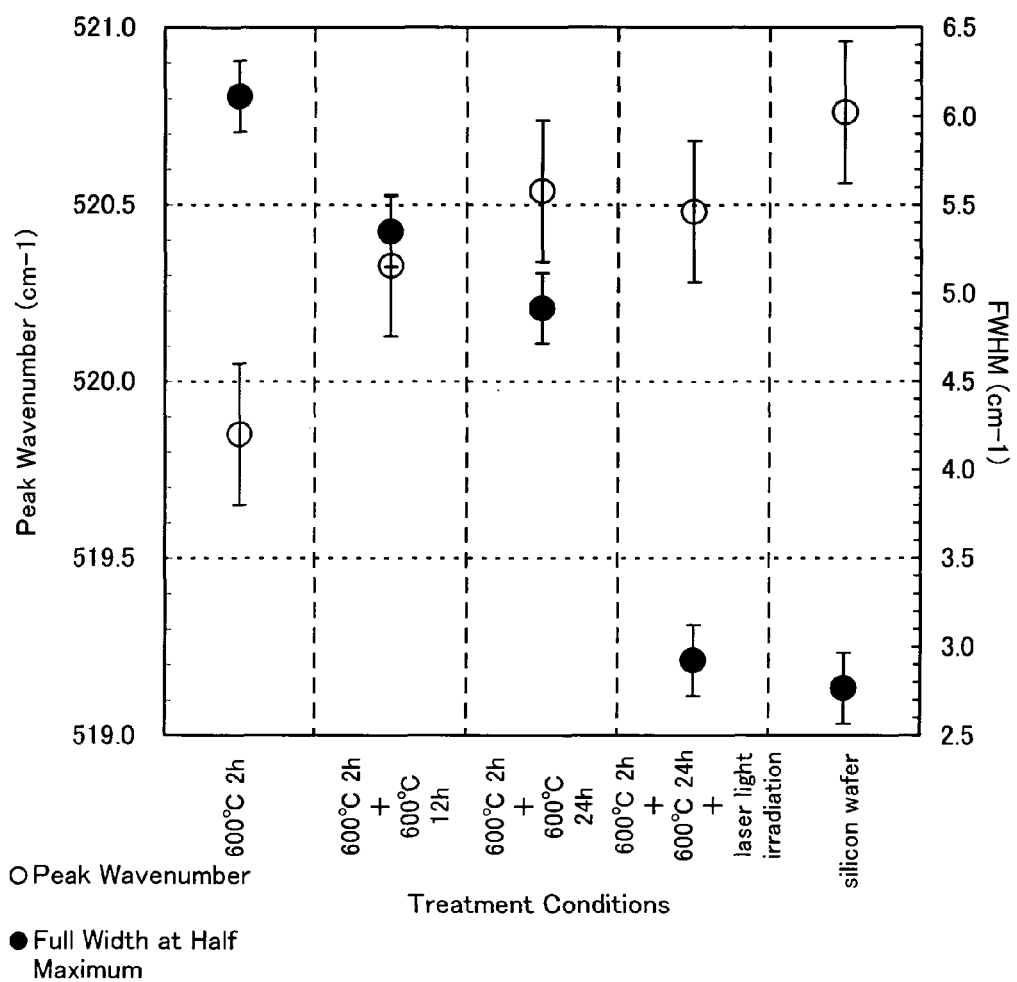
FIG. 14 is a graph in which characteristics of semiconductor films in Embodiment are compared.
Figure 15A:
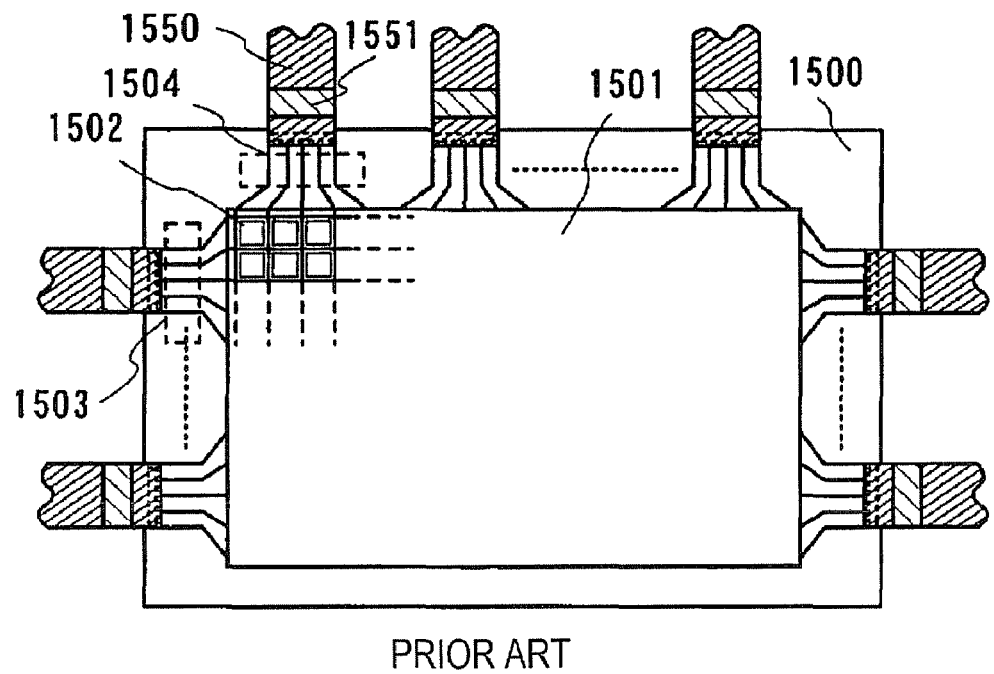
FIGS. 15A and 15B are views each illustrating a conventional semiconductor device.
Figure 15B:
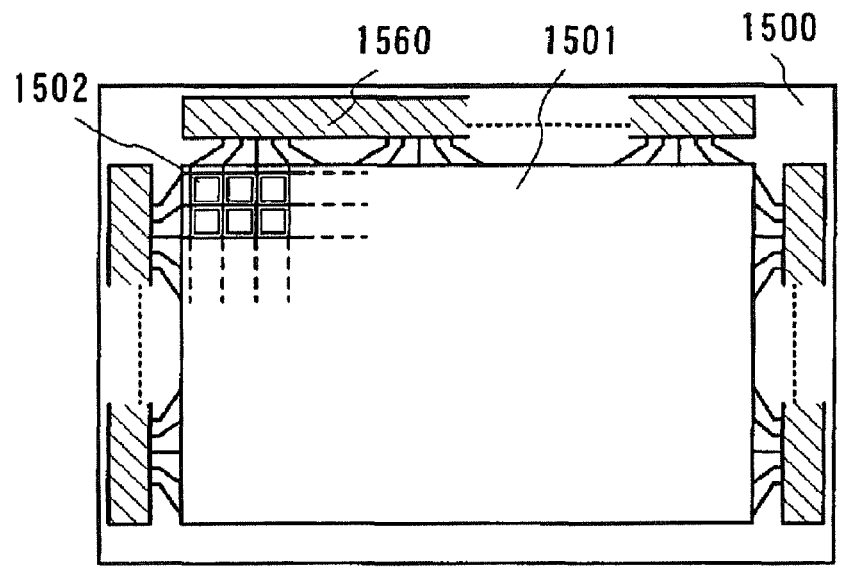

FIG. 14 illustrates summary of measurement results in FIG. 13. Here, a peak wavenumber of a Raman peak (white circles) and a full width at half maximum of a Raman peak (black circles) are illustrated. When the peak wavenumber is seen closely, the peak wavenumber is approximately 520.3 $cm^{-1}$ when heat treatment is performed for 12 hours and the peak wavenumber is approximately 520.5 $cm^{-1}$ when heat treatment is performed for 24 hours. On the other hand, when only heat treatment in separation is performed, the peak wavenumber is approximately 519.8 $cm^{-1}$. Considering that a measurement error is approximately +0.2 $cm^{-1}$, it can be said that the peak wavenumber at which an effect of heat treatment can be considered to be obtained is greater than or equal to 520.0 $cm^{-1}$. As to the upper limit of the wavenumber, a wafer can be used as a reference. That is, in consideration of a measurement error similarly, the upper limit of the wavenumber is less than or equal to 521.0 $cm^{-1}$. Note that if the peak wavenumber at which an effect of heat treatment can be considered to be obtained is defined using the wavenumber of the wafer as a reference, it can be greater than or equal to ((the peak wavenumber of a wafer) −1.0) $cm^{-1}$ and less than or equal to (the peak wavenumber of the wafer) $cm^{-1}$.

As to a heating temperature and heating time, considering that an error of a temperature is approximately ±20° C., heat treatment is preferably performed at greater than or equal to 580° C. and less than or equal to 620° C. for greater than or equal to 12 hours. The upper limit of heating time is optional; however, in consideration of throughput or the like, it is preferably less than or equal to 72 hours, more preferably, less than or equal to 48 hours.

As can be seen from FIG. 14, the full width at half maximum is largely changed depending on whether excimer laser light irradiation is performed or not. A small full width at half maximum means that many bonds between atoms are in the same state; therefore, it can be said that a single-crystal silicon layer which is irradiated with excimer laser light has characteristics closer to those of single crystals. On the other hand, a single-crystal silicon layer which is not irradiated with excimer laser light has a large full width at half maximum and bonds between atoms are not uniform. That is, it can be said that a single-crystal silicon layer which is not irradiated with excimer laser light has characteristics closer to those of polycrystals, microcrystals, or amorphous crystals as compared to the wafer.

As can be seen from measurement results in FIG. 14, a full width at half maximum of a semiconductor layer at which an effect of laser light irradiation can be considered to be obtained is less than or equal to 3.5 $cm^{-1}$. Note that with reference to a full width at half maximum of the wafer, a lower limit of the full width at half maximum of a semiconductor layer irradiated with laser light is 2.5 $cm^{-1}$ (that is, greater than or equal to 2.5 $cm^{-1}$ and less than or equal to 3.5 $cm^{-1}$). On the other hand, when the full width at half maximum is more than 3.5 $cm^{-1}$, the semiconductor layer can be considered not to be irradiated with laser light.

This embodiment can be combined with any of Embodiment Modes 1 to 5 and Embodiment 1, as appropriate.

This application is based on Japanese Patent Application Serial No. 2007-184984 filed with Japan Patent Office on Jul. 13, 2007, the entire contents of which are hereby incorporated by reference.

What is claimed is:

1. A method for manufacturing a semiconductor device comprising:
    forming a single-crystal semiconductor layer over a substrate having an insulating surface, wherein the single-crystal semiconductor layer includes a first region and a second region;
    irradiating the first region with laser light; and
    forming a circuit of a pixel portion using the second region which is not irradiated with the laser light, and a driver circuit for driving the circuit of the pixel portion using the first region which is irradiated with the laser light.

2. The method for manufacturing a semiconductor device according to claim 1, wherein a light-emitting element is formed in the pixel portion.

3. A method for manufacturing a semiconductor device, comprising:
    forming a single-crystal semiconductor layer over a substrate having an insulating surface, wherein the single-crystal semiconductor layer includes a first region and a second region;
    performing a heat treatment on the single-crystal semiconductor layer;
    irradiating the first region with laser light after the heat treatment; and
    forming a circuit of a pixel portion using the second region which is not irradiated with the laser light, and a driver circuit for driving the circuit of the pixel portion using the first region which is irradiated with the laser light.

4. The method for manufacturing a semiconductor device according to claim 3, wherein a light-emitting element is formed in the pixel portion.

5. A method for manufacturing a semiconductor device, comprising:

forming a damaged region at a predetermined depth from a surface of a single- crystal semiconductor substrate;

forming a first insulating layer over the single-crystal semiconductor substrate;

bonding the single-crystal semiconductor substrate to a substrate having an insulating surface with at least the first insulating layer interposed between the single- crystal semiconductor substrate and the substrate having an insulating surface;

separating the single-crystal semiconductor substrate at the damaged region to form a single-crystal semiconductor layer over the substrate having an insulating surface, wherein the single-crystal semiconductor layer includes a first region and a second region;

irradiating the first region with laser light; and forming a circuit of a pixel portion using the second region which is not irradiated with the laser light, and a driver circuit for driving the circuit of the pixel portion using the first region which is irradiated with the laser light.

6. The method for manufacturing a semiconductor device according to claim 5, wherein the first insulating layer is formed by a chemical vapor deposition method using an organic silane gas.

7. The method for manufacturing a semiconductor device according to claim 5, further comprising the step of forming a second insulating layer over the first insulating layer.

8. The method for manufacturing a semiconductor device according to claim 5, further comprising the step of forming a second insulating layer over the substrate having an insulating surface.

9. The method for manufacturing a semiconductor device according to claim 5, wherein the first insulating layer is formed after forming the damaged region.

10. The method for manufacturing a semiconductor device according to claim 5, wherein the damaged region is formed after forming the first insulating layer.

11. The method for manufacturing a semiconductor device according to claim 5, wherein the first insulating layer has a stacked-layer structure.

12. The method for manufacturing a semiconductor device according to claim 5, wherein the first insulating layer has a stacked-layer structure of a silicon oxynitride layer and a silicon nitride oxide layer; and wherein the silicon oxynitride layer is formed so as to be in contact with the single-crystal semiconductor substrate.

13. The method for manufacturing a semiconductor device according to claim 7, wherein the second insulating layer is formed by a chemical vapor deposition method using an organic silane gas.

14. The method for manufacturing a semiconductor device according to claim 8, wherein the second insulating layer is formed by a chemical vapor deposition method using an organic silane gas.

15. The method for manufacturing a semiconductor device according to claim 5, wherein a light-emitting element is formed in the pixel portion.

16. A method for manufacturing a semiconductor device, comprising:

forming a damaged region at a predetermined depth from a surface of a single-crystal semiconductor substrate;

forming a first insulating layer over the single-crystal semiconductor substrate;

bonding the single-crystal semiconductor substrate to a substrate having an insulating surface with at least the first insulating layer interposed between the single-crystal semiconductor substrate and the substrate having an insulating surface;

separating the single-crystal semiconductor substrate at the damaged region to form a single-crystal semiconductor layer over the substrate having an insulating surface, wherein the single-crystal semiconductor layer includes a first region and a second region;

performing a heat treatment on the single-crystal semiconductor layer;

irradiating the first region with laser light after the heat treatment; and forming a circuit of a pixel portion using the second region which is not irradiated with the laser light, and a driver circuit for driving the circuit of the pixel portion using the first region which is irradiated with the laser light.

17. The method for manufacturing a semiconductor device according to claim 16, wherein the first insulating layer is formed by a chemical vapor deposition method using an organic silane gas.

18. The method for manufacturing a semiconductor device according to claim 16, further comprising the step of forming a second insulating layer over the first insulating layer.

19. The method for manufacturing a semiconductor device according to claim 16, further comprising the step of forming a second insulating layer over the substrate having an insulating surface.

20. The method for manufacturing a semiconductor device according to claim 16, wherein the first insulating layer is formed after forming the damaged region.

21. The method for manufacturing a semiconductor device according to claim 16, wherein the damaged region is formed after forming the first insulating layer.

22. The method for manufacturing a semiconductor device according to claim 16, wherein the first insulating layer has a stacked-layer structure.

23. The method for manufacturing a semiconductor device according to claim 16, wherein the first insulating layer has a stacked-layer structure of a silicon oxynitride layer and a silicon nitride oxide layer; and wherein the silicon oxynitride layer is formed so as to be in contact with the single-crystal semiconductor substrate.

24. The method for manufacturing a semiconductor device according to claim 18, wherein the second insulating layer is formed by a chemical vapor deposition method using an organic silane gas.

25. The method for manufacturing a semiconductor device according to claim 19, wherein the second insulating layer is formed by a chemical vapor deposition method using an organic silane gas.

26. The method for manufacturing a semiconductor device according to claim 16, wherein a light-emitting element is formed in the pixel portion.

27. A method for manufacturing a semiconductor device, comprising:

forming a damaged region at a predetermined depth from a surface of a single-crystal semiconductor substrate;

forming an insulating layer over a substrate having an insulating surface;

bonding the single-crystal semiconductor substrate to the substrate having an insulating surface with at least the insulating layer interposed between the single-crystal semiconductor substrate and the substrate having an insulating surface;

separating the single-crystal semiconductor substrate at the damaged region to form a single-crystal semiconductor layer over the substrate having an insulating surface, wherein the single-crystal semiconductor layer includes a first region and a second region;

irradiating the first region with laser light; and forming a circuit of a pixel portion using the second region which is not irradiated with the laser light, and a driver circuit for driving the circuit of the pixel portion using the first region which is irradiated with the laser light.

28. The method for manufacturing a semiconductor device according to claim 27, wherein the insulating layer is formed by a chemical vapor deposition method using an organic silane gas.

29. The method for manufacturing a semiconductor device according to claim 27, wherein the insulating layer has a stacked-layer structure.

30. The method for manufacturing a semiconductor device according to claim 27, wherein a light-emitting element is formed in the pixel portion.

31. A method for manufacturing a semiconductor device, comprising:

forming a damaged region at a predetermined depth from a surface of a single-crystal semiconductor substrate;

forming an insulating layer over a substrate having an insulating surface;

bonding the single-crystal semiconductor substrate to the substrate having an insulating surface with at least the insulating layer interposed between the single-crystal semiconductor substrate and the substrate having an insulating surface;

separating the single-crystal semiconductor substrate at the damaged region to form a single-crystal semiconductor layer over the substrate having an insulating surface, wherein the single-crystal semiconductor layer includes a first region and a second region;

performing a heat treatment on the single-crystal semiconductor layer;

irradiating the first region with laser light after the heat treatment; and forming a circuit of a pixel portion using the second region which is not irradiated with the laser light, and a driver circuit for driving the circuit of the pixel portion using the first region which is irradiated with the laser light.

32. The method for manufacturing a semiconductor device according to claim 31, wherein the insulating layer is formed by a chemical vapor deposition method using an organic silane gas.

33. The method for manufacturing a semiconductor device according to claim 31, wherein the insulating layer has a stacked-layer structure.

34. The method for manufacturing a semiconductor device according to claim 31, wherein a light-emitting element is formed in the pixel portion.

* * * * *